US011463570B2

(12) United States Patent
Yoo et al.

(10) Patent No.: US 11,463,570 B2
(45) Date of Patent: Oct. 4, 2022

(54) ELECTRONIC DEVICE AND ELECTRONIC DEVICE HOUSING STRUCTURE

(71) Applicant: SAMSUNG ELECTRONICS CO., LTD., Gyeonggi-do (KR)

(72) Inventors: Minwoo Yoo, Gyeonggi-do (KR); Hyeongsam Son, Gyeonggi-do (KR); Byounguk Yoon, Gyeonggi-do (KR); Minsung Lee, Gyeonggi-do (KR); Chongkun Cho, Gyeonggi-do (KR); Jongchul Choi, Gyeonggi-do (KR); Changryong Heo, Gyeonggi-do (KR)

(73) Assignee: Samsung Electronics Co., Ltd ( * ) Notice: Subject to any disclaimer, the term of this patent is extended or adjusted under 35 U.S.C. 154(b) by 235 days.

(21) Appl. No.: 16/969,086

(22) PCT Filed: Feb. 11, 2019

(86) PCT No.: PCT/KR2019/001633
§ 371 (c)(1),
(2) Date: Aug. 11, 2020

(87) PCT Pub. No.: WO2019/156519
PCT Pub. Date: Aug. 15, 2019

(65) Prior Publication Data
US 2021/0037126 A1 Feb. 4, 2021

(30) Foreign Application Priority Data

Feb. 12, 2018 (KR) ........................ 10-2018-0017117

(51) Int. Cl.
H05K 5/03 (2006.01)
H04M 1/02 (2006.01)
(Continued)

(52) U.S. Cl.
CPC ........ *H04M 1/0266* (2013.01); *H05K 5/0017* (2013.01); *H05K 5/0217* (2013.01)

(58) Field of Classification Search
CPC . H04M 1/0266; H05K 5/0017; H05K 3/0217; H01Q 1/243; H01Q 1/085; H01Q 1/44; H01Q 1/36
(Continued)

(56) References Cited

U.S. PATENT DOCUMENTS 9,722,301 B2 * 8/2017 Kim ..................... H05K 5/0217
9,898,049 B2 * 2/2018 Myers ................... G06F 1/1656
(Continued)

FOREIGN PATENT DOCUMENTS

CN 104468885 3/2015
JP 2015141991 8/2015
(Continued)

OTHER PUBLICATIONS

PCT/ISA/210 Search Report issued on PCT/KR2019/001633, dated May 15, 2019, pp. 11.
(Continued)

*Primary Examiner* — Hai V Nguyen
(74) *Attorney, Agent, or Firm* — The Farrell Law Firm, P.C.

(57) ABSTRACT

Various embodiments disclosed in this document relate to an electronic device, for example, an electronic device comprising a conductive piece facing a housing of a metallic material, and an electronic device housing structure.

15 Claims, 29 Drawing Sheets

(51) Int. Cl.
    *H05K 5/00*         (2006.01)
    *H05K 5/02*         (2006.01)

(58) Field of Classification Search
    USPC .......................................... 455/566; 343/701
    See application file for complete search history.

(56) References Cited

U.S. PATENT DOCUMENTS

| | | | | |
|---|---|---|---|---|
| 10,234,906 | B2* | 3/2019 | Myers | G06F 1/1698 |
| 10,353,436 | B2* | 7/2019 | Myers | H05K 5/02 |
| 10,368,457 | B2* | 7/2019 | Pakula | G06F 1/1658 |
| 10,551,883 | B2* | 2/2020 | Jang | G06F 1/181 |
| 10,629,982 | B2* | 4/2020 | Kim | H01Q 1/48 |
| 10,660,523 | B2* | 5/2020 | Ando | G01J 3/0218 |
| 10,809,861 | B2* | 10/2020 | Kim | G06F 3/045 |
| 10,826,162 | B1* | 11/2020 | Jeon | H01Q 1/243 |
| 10,833,403 | B2* | 11/2020 | Kim | G06F 1/1626 |
| 10,918,284 | B2* | 2/2021 | Ando | A61B 5/0075 |
| 10,972,591 | B2* | 4/2021 | Im | H05K 5/03 |
| 11,012,766 | B2* | 5/2021 | Cho | H04R 1/026 |
| 11,088,438 | B2* | 8/2021 | Park | H01Q 1/2283 |
| 11,133,595 | B2* | 9/2021 | Park | H01Q 21/08 |
| 11,145,992 | B2* | 10/2021 | Kim | H01Q 21/064 |
| 11,196,180 | B2* | 12/2021 | Jo | H01Q 1/48 |
| 11,212,377 | B2* | 12/2021 | Jeon | G03B 15/03 |
| 11,223,712 | B2* | 1/2022 | Choi | H04M 1/0283 |
| 11,233,312 | B2* | 1/2022 | Kim | H01Q 1/085 |
| 11,243,564 | B2* | 2/2022 | Kim | G06F 1/1641 |
| 11,252,831 | B2* | 2/2022 | Moon | G06F 1/1626 |
| 11,266,011 | B2* | 3/2022 | Noh | H05K 1/115 |
| 11,283,156 | B2* | 3/2022 | Jeon | H01Q 21/28 |
| 2009/0289856 | A1* | 11/2009 | Cho | H01Q 1/243 343/702 |
| 2015/0167332 | A1* | 6/2015 | Shiota | E04G 23/0218 52/514 |
| 2016/0234360 | A1* | 8/2016 | Myers | G06F 1/1656 |
| 2016/0254588 | A1* | 9/2016 | Kim | H01Q 1/24 343/702 |
| 2016/0266613 | A1* | 9/2016 | Myers | H04M 1/0249 |
| 2017/0094818 | A1* | 3/2017 | Kim | H01R 13/2407 |
| 2017/0133748 | A1* | 5/2017 | Kim | H01Q 9/42 |
| 2017/0133752 | A1* | 5/2017 | Choi | H01Q 1/241 |
| 2017/0196112 | A1* | 7/2017 | Pakula | G06F 1/1658 |
| 2017/0242461 | A1* | 8/2017 | Jang | G06F 1/181 |
| 2017/0244153 | A1* | 8/2017 | Chen | H01Q 13/10 |
| 2017/0346164 | A1* | 11/2017 | Kim | H01Q 1/243 |
| 2018/0120904 | A1* | 5/2018 | Myers | H01Q 1/241 |
| 2019/0008388 | A1* | 1/2019 | Ando | G01J 3/0264 |
| 2020/0053919 | A1* | 2/2020 | Lee | H05K 1/0204 |
| 2020/0237227 | A1* | 7/2020 | Ando | G02B 27/48 |
| 2020/0267847 | A1* | 8/2020 | Lee | H04M 1/0274 |
| 2020/0358890 | A1* | 11/2020 | Im | H04M 1/0202 |
| 2021/0029841 | A1* | 1/2021 | Kim | H05K 5/0226 |
| 2021/0051808 | A1* | 2/2021 | Moon | G06F 1/1671 |
| 2021/0247806 | A1* | 8/2021 | Lee | G06F 1/1652 |

FOREIGN PATENT DOCUMENTS

| | | |
|---|---|---|
| KR | 1020090121973 | 11/2009 |
| KR | 1020130066854 | 6/2013 |
| KR | 1020140073098 | 6/2014 |
| KR | 101571289 | 11/2015 |
| KR | 1020160099264 | 8/2016 |
| KR | 1020170053401 | 5/2017 |
| KR | 1020170097977 | 8/2017 |
| KR | 1020170111484 | 10/2017 |
| KR | 1020170133952 | 12/2017 |

OTHER PUBLICATIONS

PCT/ISA/237 Written Opinion issued on PCT/KR2019/001633, dated May 15, 2019, pp. 4.
Korean Office Action dated Jan. 21, 2022 issued in counterpart application No. 10-2018-0017117, 13 pages.

* cited by examiner

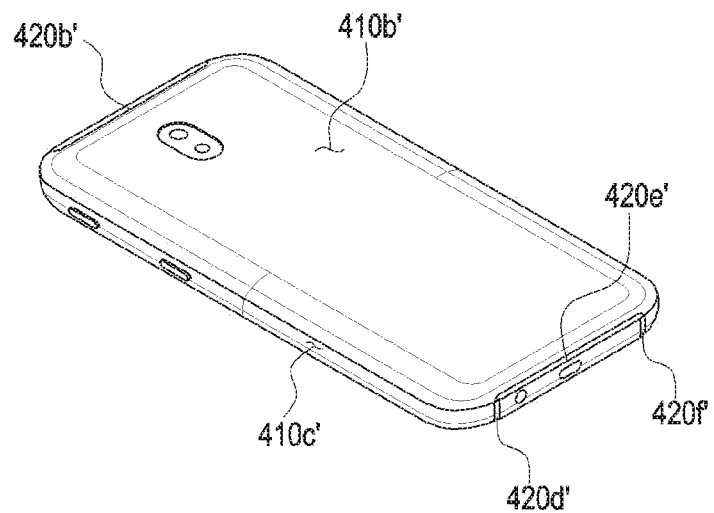
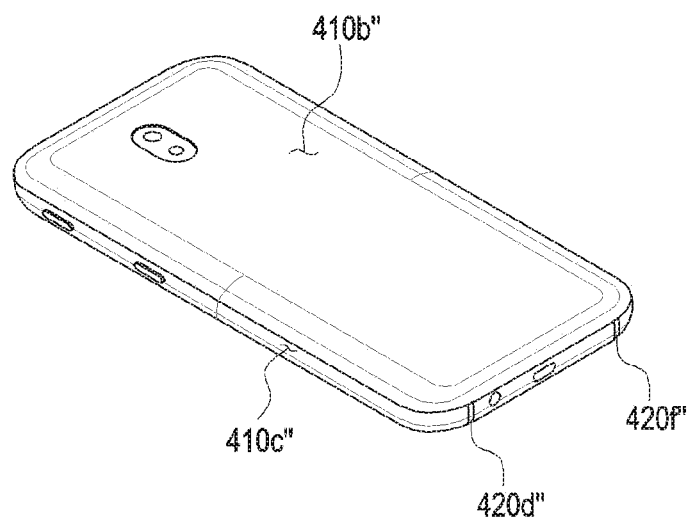
FIG.6B

[F_F' Section]

ELECTRONIC DEVICE AND ELECTRONIC DEVICE HOUSING STRUCTURE

CROSS-REFERENCE TO RELATED APPLICATION(S)

This application is a National Phase Entry of PCT international Application No. PCT/KR2019/001633, which was filed on Feb. 11, 2019, and claims priority to Korean Patent Application No. 10-2018-0017117 filed on Feb. 12, 2018, in the Korean Intellectual Property Office, the contents of each of which are incorporated herein by reference.

BACKGROUND

1. Field

Various embodiments disclosed herein relate to an electronic device and an electronic device housing structure.

2. Description of the Related Art

An electronic device (e.g., a mobile phone) may output information stored therein as sound or an image. As the integration degree of electronic devices has increased and super-high speed and large-capacity wireless communication have come to be popular, various functions have recently been provided in a single mobile communication terminal. For example, various functions, such as an entertainment function (e.g., a game function), a multimedia function (e.g., a music/video reproducing function), a communication and security function for mobile banking, a schedule management function, and an e-wallet function, are integrated in a single electronic device, in addition to a communication function.

By using a metal material in manufacturing a housing that forms the external appearance of an electronic device, various circuit devices can be protected from the external environment and the external appearance can be made beautiful.

Meanwhile, an electronic device may include at least one antenna device for a communication function. A technique for forming an antenna radiation pattern in a housing using a metal material for the purpose of increasing the rigidity of the electronic device and enhancing a design aspect has been disclosed.

SUMMARY

In order to form an antenna radiation pattern in a housing of an electronic device, at least a portion of a conductive member and at least a portion of a non-conductive member may be coupled to each other, for which a method of insert injection-molding a non-conductive material in a patterned conductive member may be used.

The bonding strength between the conductive member and the non-conductive member may vary due to various causes such as physical properties between materials. When the contact area between the conductive member and the non-conductive member is not sufficiently secured due to the reduced thickness of the housing, the bonding force between the conductive member and the non-conductive member may be reduced. The antenna radiation pattern may have a segmented shape (hereinafter referred to as a "segment portion") in the housing of the electronic device, and the contact area between the conductive member and the non-conductive member may greatly affect the bonding strength and rigidity of the segment portion.

Therefore, even if the thickness of the housing constituting the external appearance of the electronic device is to be reduced, a product is formed so as to have a thickness of a predetermined dimension (e.g., the side member having a thickness of about 2 mm) in order to provide a bonding force between the conductive member and the non-conductive member.

In manufacturing an electronic device, the external appearance of the product may be formed by performing computer numerical control (CNC) (e.g., full CNC) processing on six surfaces (front, rear, left, right, top, and bottom surfaces) of an extruded metal material. Since this full CNC method requires considerable processing time, processing costs, and material costs, it is also possible to use a manufacturing method in which forging and pressing operations are combined with a CNC process in order to reduce the number of processing steps and overall costs. However, even in this method, when the housing is manufactured to have a predetermined thickness (e.g., the side member having a thickness of 1.5 mm) or less, the rigidity of the product and the segment portion may be deteriorated.

According to various embodiments disclosed herein, it is possible to provide an electronic device capable of securing rigidity of a housing constituting an external appearance.

Various embodiments disclosed herein may provide an electronic device including a housing that includes: a front plate; a rear plate facing a direction opposite a direction faced by the front plate; and a side member formed integrally with the rear plate and surrounding the space between the front plate and the rear plate, wherein a substantial portion of the rear plate and the side member may be formed of an electrically conductive member, and wherein the rear plate and the side member include a slit extending from a first portion of the side member to a third portion of the side member through a second portion of the rear plate, thereby separating the substantial portion of the rear plate and the side member into two portions; an insulating material filling the slit; a display exposed through the front plate; a polymer structure that is in contact with at least one portion of the first portion, at least a portion of the second portion, and at least a portion of the slit, and at least one conductive piece at least partially mounted on the polymer structure.

Various embodiments disclosed herein may provide an electronic device including: a housing including a rear plate, a side member disposed in at least a portion of a periphery of the rear plate; a polymer structure that is in contact with at least a portion of the rear plate and at least a portion of the side member; a slit continuously formed in at least a portion of the rear plate and at least a portion of the side member; and at least one conductive piece having the same material as the side member, wherein the conductive piece is disposed at the position where the slit is formed, to face the side member.

Various embodiments disclosed herein may provide an electronic device housing including: a first surface, a second surface facing a direction opposite a direction faced by the first surface, and a side member surrounding the space formed between the first surface and the second surface and formed integrally with or separately from the second surface. The side member may include: a first electrically conductive member including a first electrically conductive material; a second electrically conductive member including the first electrically conductive material and electrically insulated from the first electrically conductive member; a third electrically conductive member disposed in the space to face at least one of the first electrically conductive member and the second electrically conductive member; and a polymer structure disposed adjacent to the first, second, and third electrically conductive members.

An electronic device according to various embodiments disclosed herein includes a conductive piece formed adjacent to the side member of the housing. Thus, it is possible to form a housing having a thickness smaller than that formed by the conventional housing manufacturing method.

According to various embodiments disclosed herein, it is possible to provide an electronic device in which high rigidity and bonding strength are secured in a segment portion of a final product and a housing.

According to a method of manufacturing an electronic device housing according to various embodiments disclosed herein, a metal sheet and/or a metal plate is pressed to roughly form the shapes of a case and/or a housing, and then is cut into designed shapes through trimming or CNC processing. As a result, it is possible to reduce a manufacturing time and material consumption compared to the case where an electronic device is manufactured by processing a conventional metal block.

BRIEF DESCRIPTION OF THE DRAWINGS

FIG. 6B illustrates perspective views illustrating various embodiments of the rear surface of an electronic device disclosed herein;

DETAILED DESCRIPTION

Figure 1:
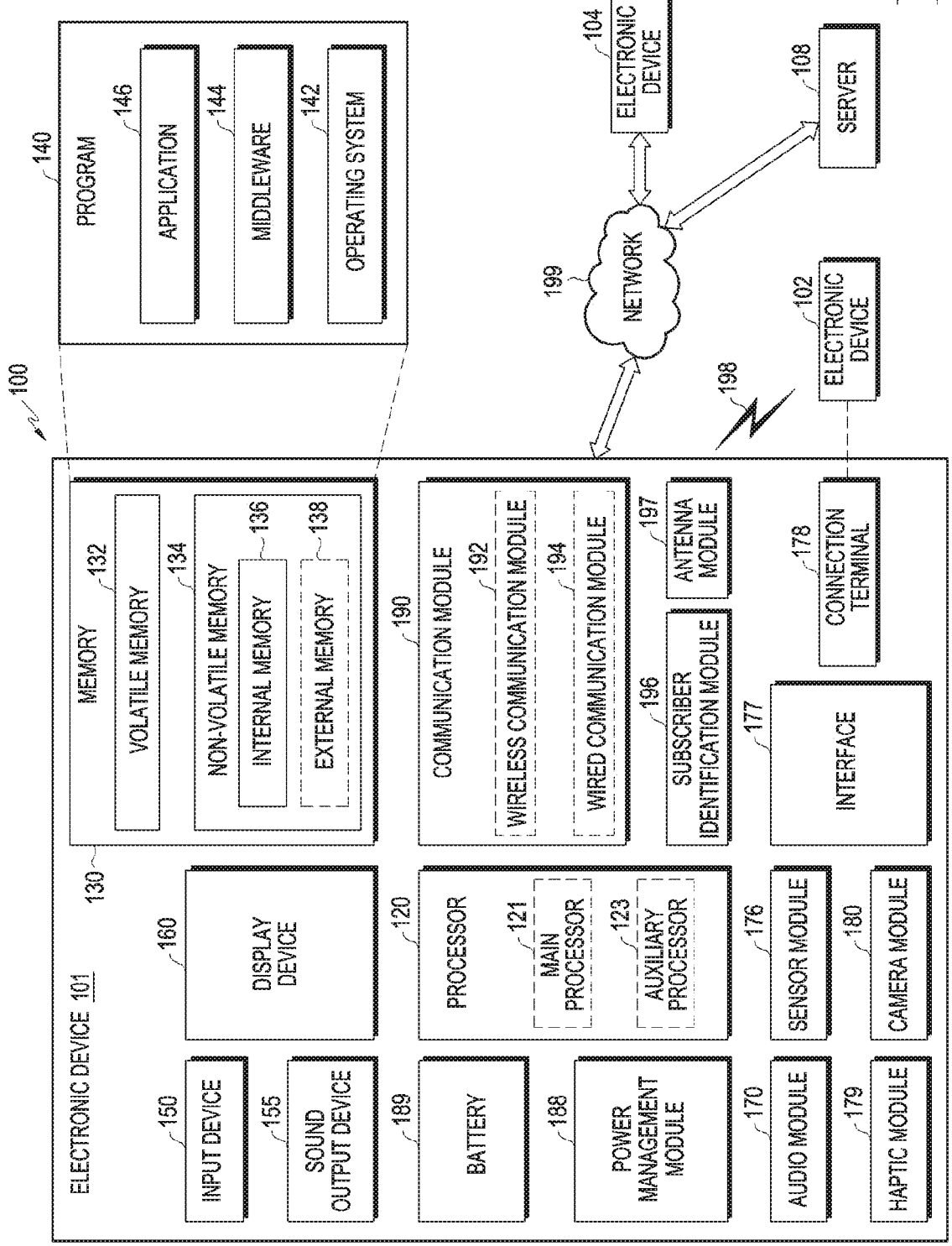
FIG. 1 is a block diagram of an electronic device according to various embodiments disclosed herein in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
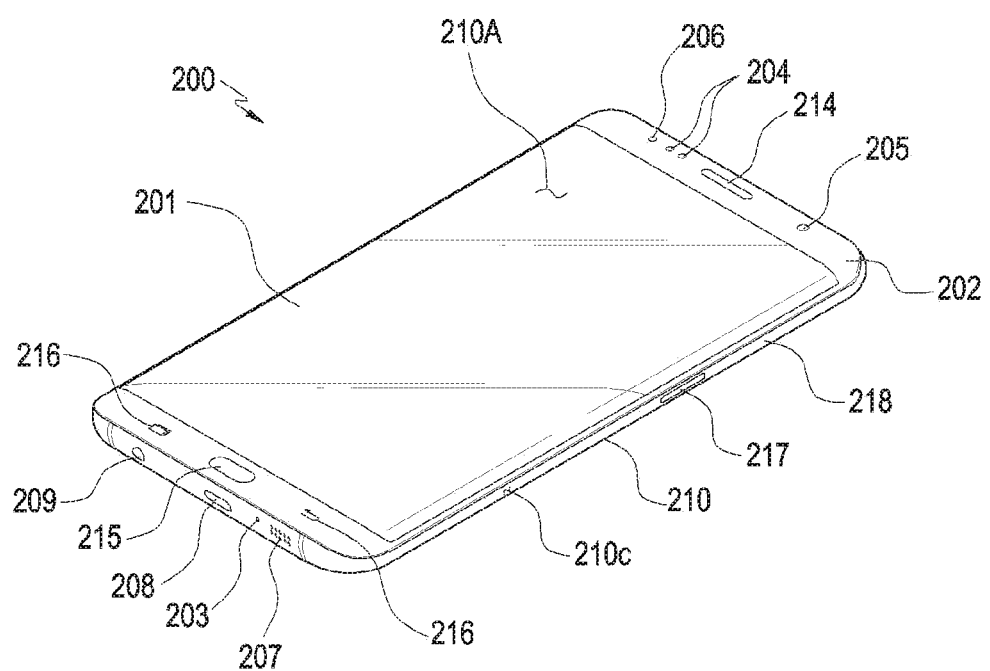
FIG. 2 is a front side perspective view of an electronic device according to various embodiments disclosed herein.
Figure 3:
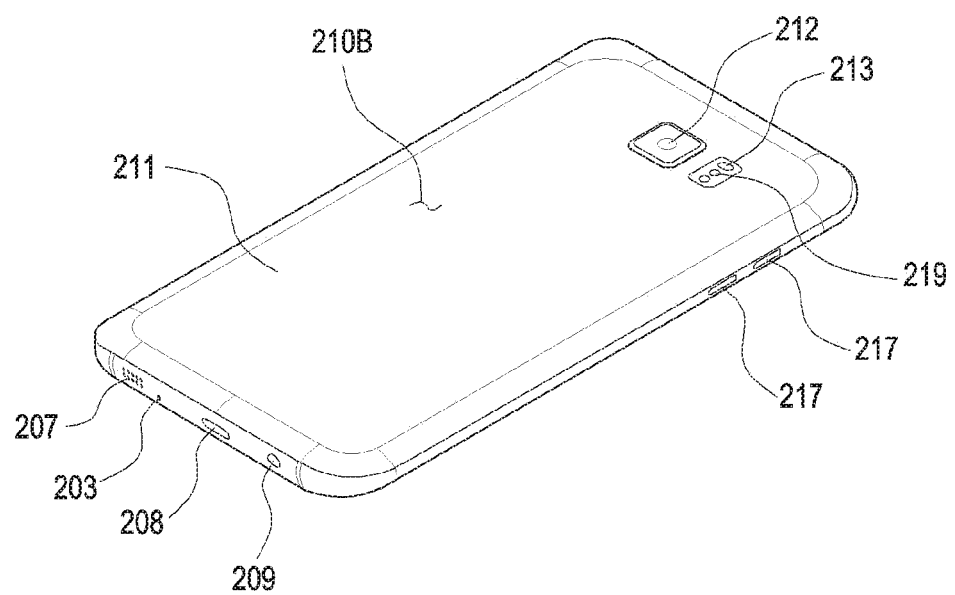
FIG. 3 is a rear side perspective view of an electronic device according to various embodiments disclosed herein.

FIG. 2 is a front side perspective view of an electronic device according to various embodiments disclosed herein. FIG. 3 is a rear side perspective view of an electronic device according to various embodiments disclosed herein.

Referring to FIGS. 2 and 3, an electronic device 200 according to an embodiment may include a housing 210 including a first surface (or a front surface) 210A, a second surface (or a rear surface) 210B, and a side surface 210C surrounding the space between the first surface 210A and the second surface 210B. In another embodiment (not illustrated), the term "housing" may refer to a structure forming some of the first surface 210A, the second surface 210B, and the side surfaces 210C of FIG. 1. According to an embodiment, at least a portion of the first surface 210A may be formed by a substantially transparent front plate 202 (e.g., a glass plate or a polymer plate including various coating layers). The second surface 210B may be formed by a substantially opaque rear plate 211. The rear plate 211 may be formed of, for example, coated or colored glass, ceramic, polymer, metal (e.g., aluminum, stainless steel (STS), or magnesium), or a combination of two or more of these materials. The side surface 210C may be formed by a side bezel structure 218 (or a "side member") coupled to the front plate 202 and the rear plate 211 and including metal and/or polymer. In some embodiments, the rear plate 211 and the side bezel structure 218 may be integrally formed, and may include the same material (e.g., a metal material such as aluminum).

According to an embodiment, the electronic device 200 may include one or more of a display 201, audio modules 203, 207, and 214, sensor modules 204 and 219, camera modules 205, 212, and 213, key input devices 215, 216, and 217, an indicator 206, and connector holes 208 and 209. In some embodiments, in the electronic device 200, at least one of the components (e.g., the key input devices 215, 216, or 217 or the indicator 206) may be omitted, or other components may be additionally included.

The display 201 may be exposed through, for example, a large portion of the front plate 202. The display 201 may be coupled to or disposed adjacent to a touch-sensing circuit, a pressure sensor capable of measuring touch intensity (pressure), and/or a digitizer configured to detect a magnetic-field-type stylus pen.

The audio modules 203, 207, and 214 may include a microphone hole 203 and speaker holes 207 and 214. The microphone hole 203 may include a microphone disposed therein so as to acquire external sound, and in some embodiments, multiple microphones may be disposed therein so as to detect the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker may be included without the speaker holes 207 and 214 (e.g., a piezo speaker).

The sensor modules 204 and 219 may generate electrical signals or data values corresponding to the internal operating states or the external environmental states of the electronic device 200. The sensor modules 204 and 219 may include, for example, a first sensor module 204 (e.g., a proximity sensor) and/or a second sensor module (not illustrated) (e.g., a fingerprint sensor) disposed on the first surface 210A of the housing 210, and/or a third sensor module 219 (e.g., an HRM sensor) disposed on the second surface 210B of the housing 210. The fingerprint sensor may be disposed not only on the first surface 210A of the housing 210 (e.g., the home key button 215), but also on the second surface 210B. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 204.

The camera modules 205, 212, and 213 may include a first camera device 205 disposed on the first surface 210A of the electronic device 200 and a second camera device 212 disposed on the second surface 210B, and/or a flash 213. The camera modules 205 and 212 may include one or more lenses, an image sensor, and/or an image signal processor. The flash 213 may include, for example, a light-emitting diode or a xenon lamp. In some embodiments, two or more lenses (e.g., a wide-angle lens and a telephoto lens) and image sensors may be disposed on one surface of the electronic device 200.

The key input devices 215, 216, and 217 may include a home key button 215 disposed on the first surface 210A of the housing 210, a touch pad 216 disposed in the vicinity of the home key button 215, and/or a side key button 217 disposed on the side surface 210c of the housing 210. In another embodiment, the electronic device 200 may not include some or all of the above-mentioned key input devices 215, 216, and 217, and a non-included key input device 215, 216, or 217 may be implemented in another form such as a soft key on the display 201.

The indicator 206 may be disposed on, for example, the first surface 210A of the housing 210. The indicator 206 may include the state information of the electronic device 200 in an optical form, and may include an LED.

The connector holes 208 and 209 may include a first connector hole 208 that is capable of accommodating a connector (e.g., a USB connector) for transmitting and receiving power and/or data to and from an external electronic device, and/or a second connector hole 209 that is capable of receiving a connector (e.g., an earphone jack) for transmitting and receiving an audio signal to and from an external electronic device.

Figure 4:
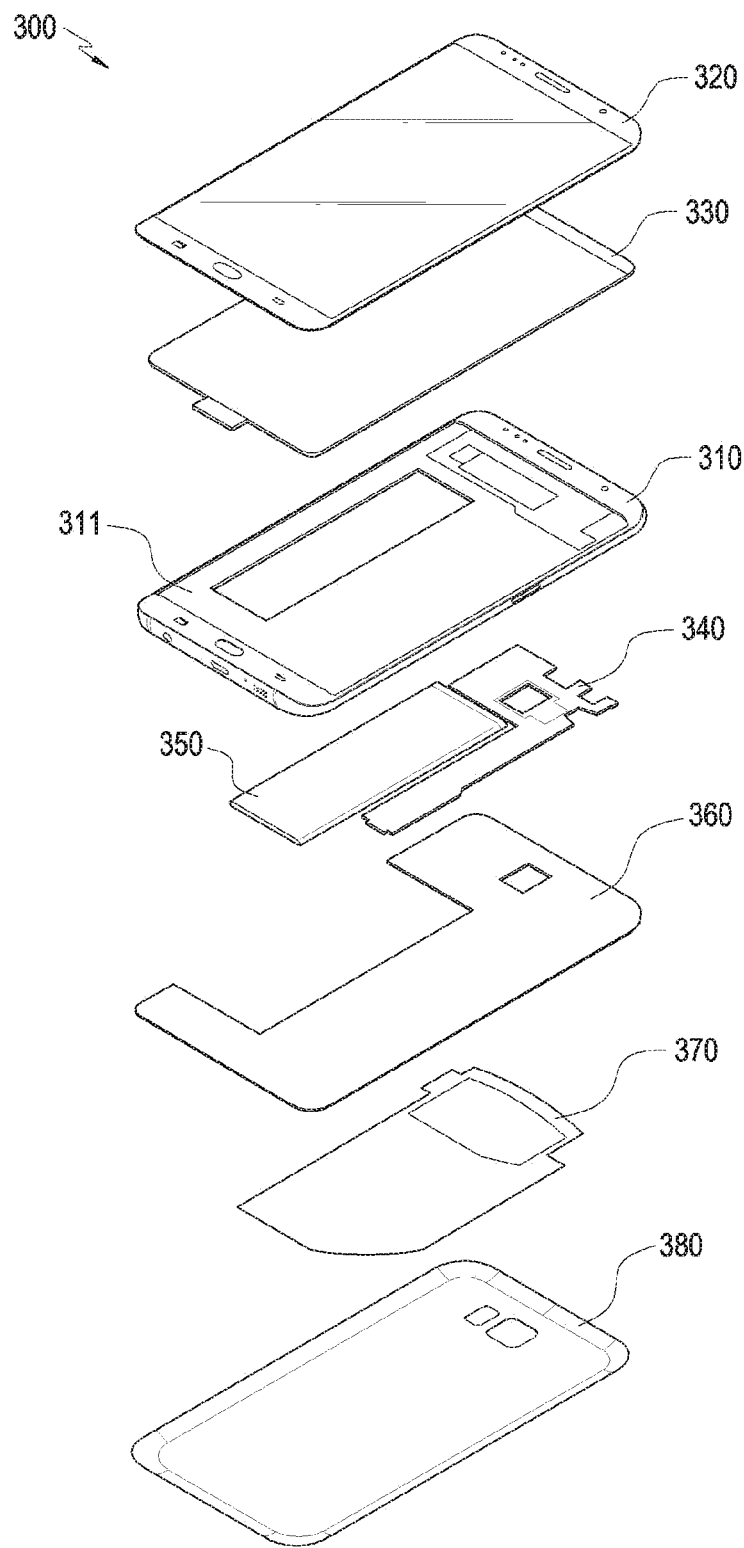
FIG. 4 is an exploded perspective view of an electronic device according to various embodiments disclosed herein.

FIG. 4 is an exploded perspective view of an electronic device according to various embodiments disclosed herein.

Referring to FIG. 4, an electronic device 300 according to various embodiments disclosed herein may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or other components may be additionally included in the electronic device 300. At least one of the components of the electronic device 300 may be the same as or similar to at least one of the components of the electronic device 200 of FIG. 1 or 2, and a redundant description thereof is omitted below.

The first support member 311 may be disposed inside the electronic device 300 so as to be connected to the side bezel structure 310 or may be formed integrally with the side bezel structure 310. The first support member 311 may be formed of, for example, a metal material and/or a non-metal material (e.g., a polymer). The display 330 may be coupled to one surface of the first support member 311, and the printed circuit board 340 may be coupled to the other surface of the first support member 311. On the printed circuit board 340, a processor, a memory, and/or an interface may be mounted. The processor may include at least one of, for example, a central processing unit, an application processor, a graphics processor, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 300, to an external electronic device, and may include a USB connector, an SD card/an MMC connector, or an audio connector.

The battery 350 is a device for supplying power to at least one component of the electronic device 300, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 300, or may be detachably disposed on the electronic device 300.

The antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by the side bezel structure 310, a portion of the first support member 311, or a combination thereof.

Figure 5:
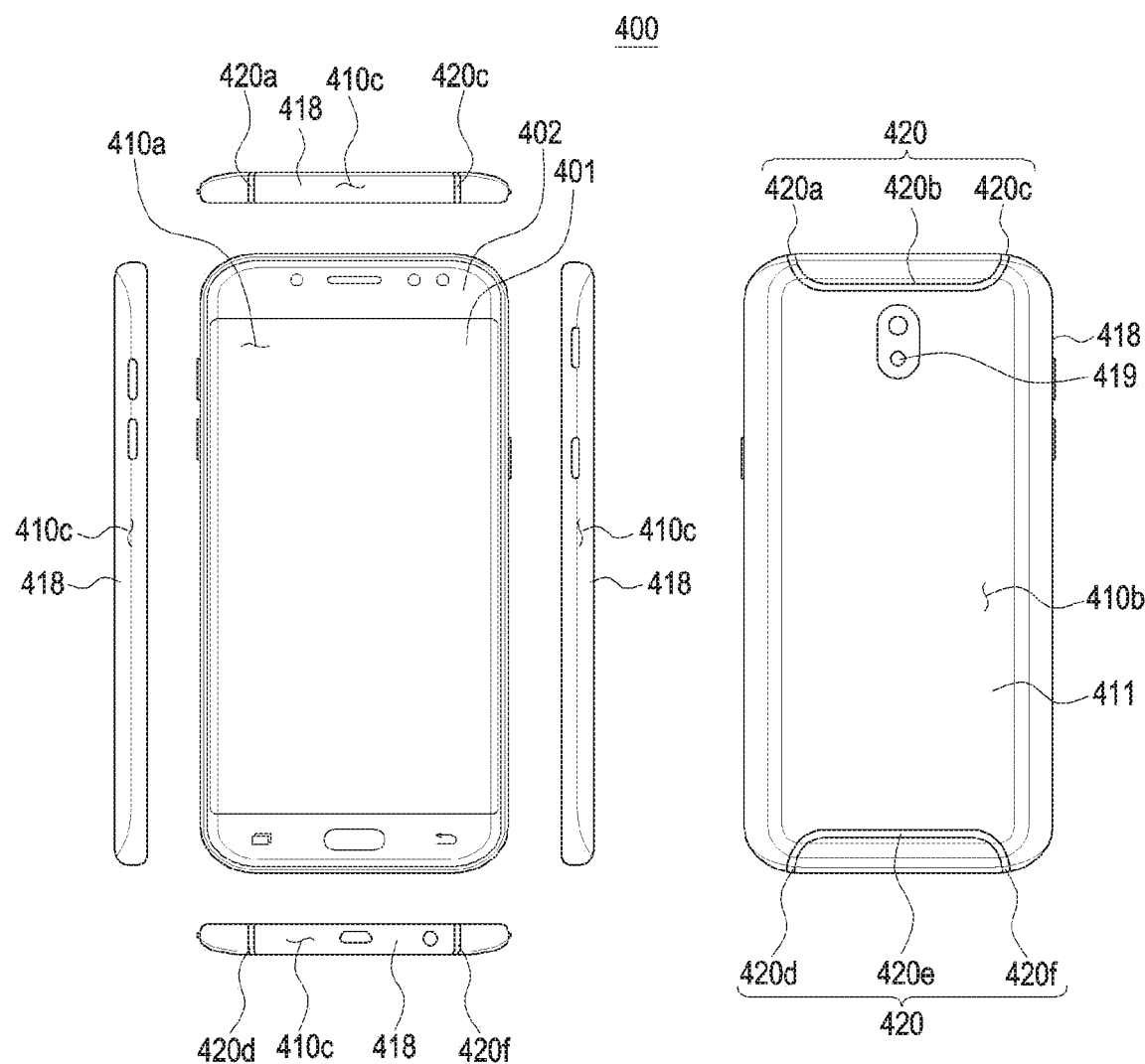
FIG. 5 is a perspective view illustrating the front surface, rear surface, and side surface of an electronic device according to various embodiments disclosed herein.
Figure 6A:
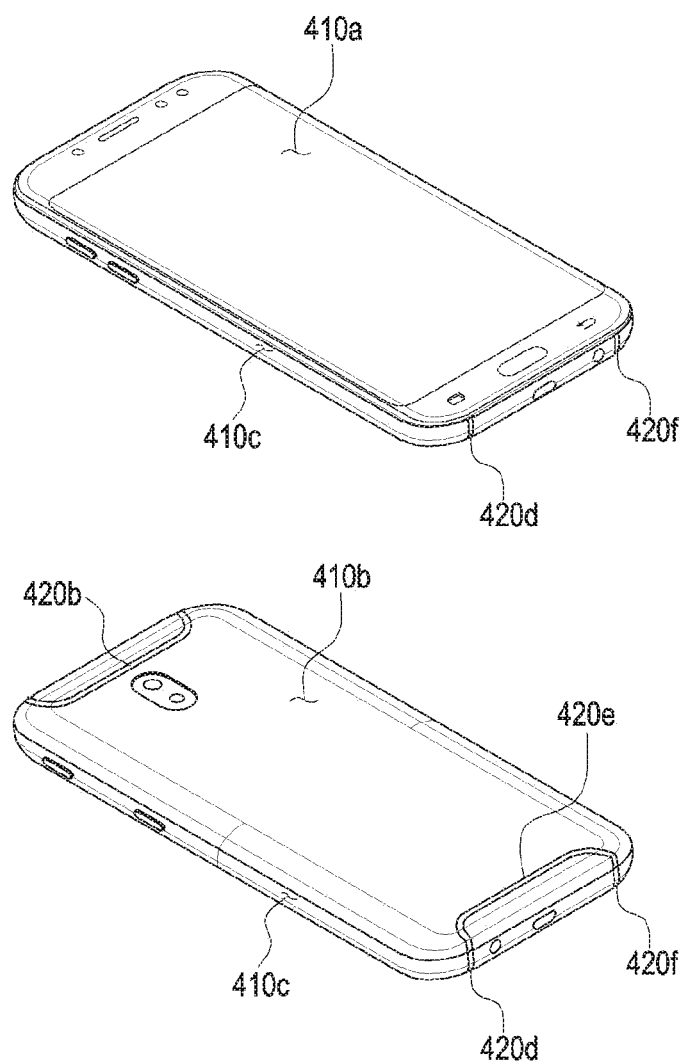
FIG. 6A is the front and the rear surface perspective view of an electronic device according to various embodiments disclosed herein.

FIG. 5 is a perspective view illustrating the front surface, rear surface, and side surface of an electronic device 400 according to various embodiments disclosed herein. FIG. 6A is a perspective view illustrating the front surface 410a and the rear surface 410b of an electronic device (e.g., 400 in FIG. 5) according to various embodiments disclosed herein. FIG. 6B illustrates perspective views illustrating various embodiments of the rear surface 410' or 410" of an electronic device (e.g., 400 in FIG. 5) disclosed herein.

Referring to FIG. 5, the electronic device 400 (e.g., the electronic device 101 or 200) according to various embodiments disclosed herein may include: a housing including a front plate 402 (e.g., the front plate 202 or 320), a rear plate 411 facing away from the front plate 402 (e.g., the rear plate 211 or 380), and a side member (418) (e.g., the side bezel structure 218 or 310) surrounding the space between the front plate 402 and the rear plate 411; and a display 401 (e.g., the display 201 or 300) exposed through the front plate 402.

According to various embodiments disclosed herein, the housing may have a first surface 410a formed by the front plate 402, a second surface 410b formed by the rear plate 411, a third surface 410c formed by the side member 418. According to an embodiment, the first surface 410a and the second surface 410b may be oriented in different directions, and the third surface 410c may be perpendicular to each of the first surface 410a and the second surface 410b.

According to various embodiments disclosed herein, when the rear plate 411 is formed in a substantially rectangular shape, the third surface 410c formed by the side member 418 has four surfaces corresponding to the shape of the periphery of the rear plate 411, and the four surfaces may face different directions.

Referring to FIGS. 5 and 6A together, at least one slit 420b may be formed in the rear plate 411 according to various embodiments. According to various embodiments, at least a portion of the slit 420b formed in the rear plate 411 has a predetermined width, and may extend from one portion of the rear plate 411 to another portion. For example, as illustrated in FIGS. 5 and 6A, the slit 420b may be formed to extend in a direction parallel to the horizontal side of the rear plate 411 disclosed herein. According to another embodiment, as illustrated in the drawings, the slit 420b may extend from one portion of the rear plate 411 to another portion in a regular pattern, and according to another embodiment, the slit 420b may extend irregularly from one portion of the rear plate 411 to another portion.

According to various embodiments, the slit 420b formed in the rear plate 411 may have a continuous shape. However, according to various embodiments is not limited thereto, alternatively, the slit 420b formed in the rear plate 411 may have a part in a discrete shape, but may have a discrete shape. For example, each slit 420b illustrated in FIGS. 5 and 6A has a continuous shape of a single slit 420b, but is not limited thereto. According to various embodiments, the slit 420b may have a separate shape on the rear plate 411, or may be formed such that all or at least a portion of the slit is not exposed to the outside. For example, when at least a portion of the rear plate 411 is formed of a material such as glass or synthetic resin, the slit 420b may have a separate shape or may be formed such that all or at least a portion of the slit 420b is not exposed to the outside. This will be described later with reference to FIG. 6B.

According to various embodiments, at least one slit 420 may also be formed in the side member 418. The at least one slit 420 formed in the side member 418 may be formed in order to use at least a portion of the side member 418 as an antenna. For this purpose, in an embodiment disclosed herein, slits 420 may be formed so as to isolate at least a portion of the side member 418 and to segment the portion from the other portion of the side member 418. The number of slits 420 or the shape of the slits 420 is not limited to any particular embodiment.

In order to use at least a portion of the side member 418 as an antenna, in various embodiments disclosed herein, at least one slit 420 is formed in at least one of multiple third surfaces 410c of the side member 418. According to an embodiment, two slits 420 may be formed in any one of the multiple third surfaces 410c of the side member 418. For example, as an embodiment, FIG. 5 illustrates that two slits 420a and 420c are formed on the top surface among the multiple third surfaces 410c of the side member 418. According to another embodiment, unlike the one illustrated in the drawing, one slit 420 may be formed on one surface (e.g., the top surface) among the multiple third surfaces 410c of the side member 418, and one slit 420 may be formed in another surface (e.g., the right surface) adjacent thereto among the multiple third surfaces 410c of the side member 418. According to still another embodiment, three or more slits 420 may be formed in any one of the multiple third surfaces 410c of the side member 418.

According to various embodiments, when two slits 420a and 420c are formed in one (e.g., the top surface) of the multiple third surfaces 410c, the two slits 420a and 420c may be spaced apart from each other by a predetermined distance. According to an embodiment, the two slits 420a and 420c are symmetrical to each other about an imaginary line drawn in the vertical direction from the center of one (e.g., the top surface) of the multiple third surfaces 410c.

The slits (e.g.; 420) may be provided in multiple regions within a single electronic device (e.g., 400 in FIG. 5). For example, as illustrated in FIGS. 5 and 6A, in addition to the slits 420a and 420c formed in the top surface, which is one of the multiple surfaces of the side member 418, slits 420d and 420f may also formed in the bottom surface which is another surface among the multiple surfaces of the side member 418. In FIGS. 5 to 6B, two slits are provided in each of the top and bottom portions of the electronic device, but are not limited thereto. The slits 420 according to various embodiments of the disclosure may be implemented in the same form or in a modified form in other surfaces not mentioned among the multiple third surfaces 410c of the side member 418. It should be noted that, according to various embodiments disclosed herein, in the second surface 410b or the third surface 410c, at least one slit may be additionally or alternatively disposed at a position not illustrated in the drawings. According to various embodiments, the slits 420 may be variously set depending on omission or addition of at least one component among a display (e.g., 201), audio module (e.g., 203, 207, and 214), sensor modules (e.g., 204 and 219), camera modules (e.g., 205, 212, and 213), key input devices (e.g., 215, 216, and 217), an indicator (e.g., 206), or connector holes 208 and 209, and various arrangements of the components.

Hereinafter, for convenience of description, description may be made based on the slits 420a and 420c located in the top surface among the multiple third surfaces 410c of the side member 418, when viewed from above of the housing. Referring back to FIGS. 5 and 6A again, according to various embodiments disclosed herein, the slit 420b formed in the rear plate 411 and the slits 420a and 420c formed in the side member 418 may be connected to each other. According to various embodiments, when the slit 420b and the slits 420a and 420c are connected to each other, one non-discrete slit 420 may be formed over the side member 418 and the rear plate 411, and may have a partially curved shape. Although not illustrated in the drawings, according to some embodiments, when the slit 420b and the slits 420a and 420c are connected to each other, a portion of at least one of the slits 420b, 420a, and 420c may be discrete.

In various embodiments disclosed herein, the slit 420 can segment a portion of the housing such that at least a portion of the housing can implement the function as an antenna. According to various embodiments, the housing may include a conductive material (e.g., metal) in at least a portion thereof so as to implement the portion as an antenna. According to this, the shape or dimensions (length, height, area, etc.) of the housing including a conductive material (e.g., metal) can be adjusted to configure various antennas having a designated wavelength band. The housing may be divided into a housing included in one component of the antenna and a housing not included in the antenna, and the housing included as the antenna and the housing not included in the antenna may not be in contact with each other, using the slit 420.

According to an embodiment, at least a portion of the housing made of a conductive material (e.g., metal) may be isolated through the slit 420, and when another conductive material (e.g., metal) is disposed around the isolated housing, the conductive material can block contact between the isolated housing and the another conductive material. For example, when at least a portion of the second surface 410*b* of the rear plate 411 is formed of a metal material, it is possible to implement the function of the antenna by connecting the slit 420*b* formed in the second surface 410*b* of the rear plate 411 and the slits 420*a* and 420*c* formed in the third surface 410*c* of the side member 418 to each other, and forming an insulator in the slits 420*a*, 420*b*, and 420*c* forming a segment portion.

According to various embodiments, the slit 420*b* formed in the second surface 410*b* of the rear plate 411 may divide the rear plate 411 into two or more portions. For example, when the rear plate 411 can be divided into two portions, according to an embodiment, at least one portion may be formed of a conductive material (e.g., metal), and may be included in a portion of the configuration performing the antenna function. According to another embodiment, when the slit 420*b* formed in the rear plate 411 is connected to the slits 420*a*, 420*c* formed in the side member 418, the housing including the rear plate 411 and the side member 418 can be divided into two substantial portions by the slit 420*a*, 420*b*, and 420*c*. One of the two substantial portions may be an area utilized as an antenna (hereinafter, referred to as an "antenna area"), and the other may be an area not utilized as an antenna (hereinafter, referred to as a "non-antenna area").

In some embodiments, the slit 420*b* may be located at the edge of the second surface 410*b* of the rear plate 411, and the rear plate 411 may not be divided into two portions. FIG. 6B illustrates rear plates 411' and 411" according to embodiments different from that in FIG. 6A, and the slit 420*b* illustrated in the upper drawing of FIG. 6B may be an embodiment for the slit 420*b* that does not divide the rear plate 411' into two portions.

In addition, according to an embodiment, as illustrated in the lower drawing of FIG. 6B, a slit (e.g., 420) may not be formed in the rear plate 410*b*". This case may correspond to the case in which at least a portion of the rear plate 410*b*" is formed of an insulator such as glass or synthetic resin. According to an embodiment, in the case where the rear plate 410*b*" is an insulator, even if a segment portion is formed by a slit (e.g., 420) and the slit is not separately filled with an insulating material, a housing implementing a function as an antenna can be configured. According to this, as illustrated in the lower drawing of FIG. 6B, slits 420*d*" and 420*f*" formed in the third surface 410*c* of the side member 418 may not be connected to each other. In this case, the slits 420*d*" and 420*f*" formed in the third surface 410*c* may be formed independently of each other.

Figure 7A:
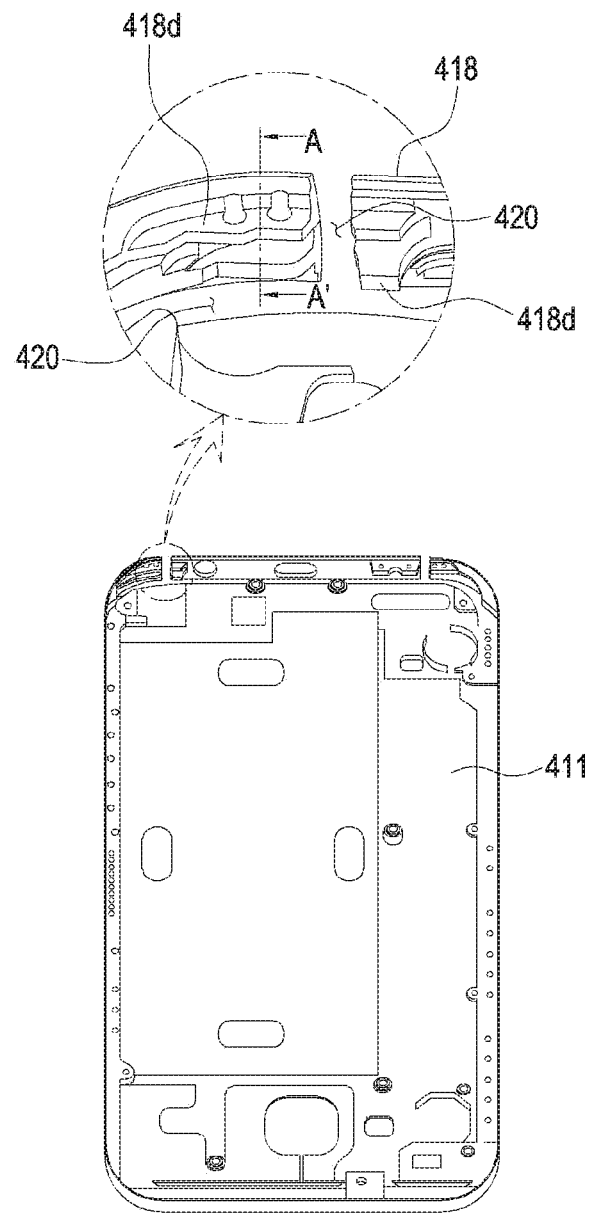
FIG. 7A is a view illustrating a side member and a rear plate of an electronic device according to an embodiment disclosed herein when viewed from the inside of the electronic device housing.
Figure 7B:
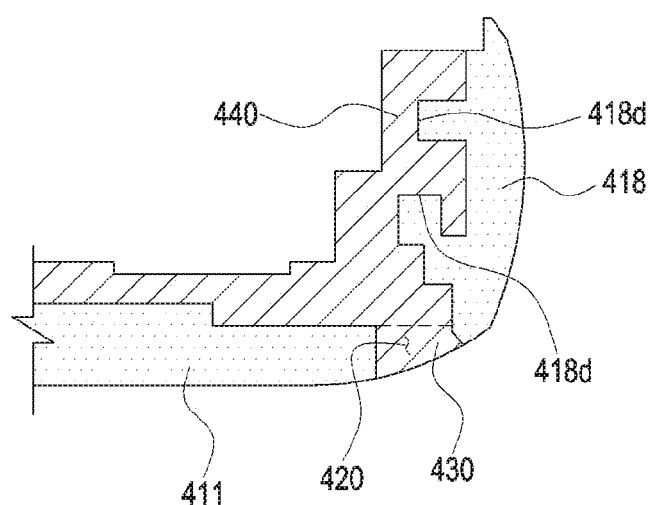
FIG. 7B is a cross-sectional view illustrating a coupling relationship between a side member, a rear plate, an insulating material, and a polymer structure of an electronic device according to an embodiment disclosed herein.

FIG. 7A is a view illustrating a side member 418 and a rear plate 411 of an electronic device (e.g., 400 in FIG. 5) according to an embodiment disclosed herein when viewed from the inside of the electronic device housing. FIG. 7B is a cross-sectional view illustrating a coupling relationship between a side member 418, a rear plate 411, an insulating material 430, and a polymer structure 440 of an electronic device (e.g., 400 in FIG. 5) according to an embodiment disclosed herein.

Referring to FIGS. 7A and 7B together, a shape around the slit 420 according to various embodiments may be illustrated. According to an embodiment, one or more concave-convex portions 418*d* may be formed around the slit 420. According to various embodiments, a portion of the independent antenna may be prevented from being deformed by an external impact through the concave-convex portions 418*d* formed around the slit 420. According to various embodiments, the concave-convex portions 418*d* may be used as leg engagement portions for anodizing and may be used as an electric current conduction path.

FIGS. 7A and 7B illustrate an embodiment of the concave-convex portions 418*d* formed on the inner surface of the electronic device (e.g., 400) and may illustrate, for example, that the inner shape of the housing including the slit 420 are formed through an injection-molding process and/or a CNC process. According to various embodiments, the inner and outer shapes of the housing may be variously formed through an injection-molding and/or a CNC processes.

Referring to FIGS. 7A and 7B together, an electronic device (e.g., 400 in FIG. 5) according to various embodiments disclosed herein may include an insulating material 430 filling multiple slits 420 formed in the rear plate 411 and the side member 418. The insulating material 430 may serve to limit conduction between some components of the electronic device (e.g., 400 of FIG. 5) and some other components. For example, when the housing of the electronic device (e.g., 400 in FIG. 5) is a conductive material (e.g., metal), the insulating material 430 may be used to make an electrical disconnection between some of the components of the housing and other components so as to make the housing of the electronic device (e.g., 400 in FIG. 5) function as an antenna.

According to various embodiments, the electronic device (e.g., 400 in FIG. 5) may include a polymeric structure 440 connected to at least one of the rear plate 411, the side member 418, or the slit 420. According to various embodiments disclosed herein, the polymer structure 440 may be coupled to the concave-convex portions 418*d* so as to increase the rigidity of the housing, and may serve to prevent foreign matter from entering the housing.

The polymer structure 440 may also serve to limit conduction between some components of the electronic device (e.g., 400 in FIG. 5) and some other components. For this purpose, the polymer structure 440 may be composed of various materials having an insulating function or a combination thereof. According to various embodiments, the polymer structure 440 may be formed of the same material as the insulating material 430 to exert an insulating function, but may be formed of a material different from the insulating material 430 to exert an insulating function. According to various embodiments disclosed herein, the insulating material 430 serves to limit the conduction of the housing, and the polymer structure 440 may serve to limit the conduction of the electronic device (e.g., 400 in FIG. 5) including the housing.

According to an embodiment, the polymer structure 440 is integrally formed with the insulating material 430 (e.g., injection-molding of the insulating material 430 and the polymer structure 440 in one process using the same injection-molding apparatus, and may be substantially the same as the insulating material 430. According to various embodiments, as a method of manufacturing a housing of an electronic device (e.g., 400 in FIG. 5), the polymer structure 440 may be formed after first filling the slit 420 with the insulating material 430, or the polymer structure 440 may be formed first and then the slit 420 may be filled with the insulating material 430.

The polymer structure 440 according to an embodiment may be formed to surround at least a portion of the concave-convex portions 418d formed on the rear plate 411 or the side member 418. The polymer structure 440 according to an embodiment may be formed by an insert injection-molding method, and in this case, the polymer structure 440 may have a shape of the concave-convex portions 418d formed on the rear plate 411 or the side member 418 or a shape corresponding to a mold shape (a mold shape at a position outside the concave-convex portions 418d), thereby filling the side of the housing.

For example, as illustrated in FIGS. 7A and 7B, when the inner surface shape of the rear plate 411 or the side member 418 protrudes, recesses (e.g., the portions inwardly recessed by the concave-convex portions 418d in the polymer structure 440 in FIG. 7B) accommodating the inner surface shape may be formed in the polymer structure 440, which is in contact with the rear plate 411 or the side member 418. As another embodiment, when a recess is formed in the inner surface of the rear plate 411 or the side member 418, a protruding structure accommodated in the inner surface shape of the rear plate 411 or the side member 418 may be formed on the polymer structure 440 so as to be in contact with the recess. According to an embodiment, when the inner surface shape of the rear plate 411 or the side member 418 is stepped, the polymer structure 440 may be formed to substantially surround the stepped portion, and the rear plate 411 and the polymer structure 440, or the side member 418 and the polymer structure 440 may be coupled to each other. According to various embodiments, the rear plate 411 and the side member 418 may be directly connected to each other, but may be indirectly connected to each other, using the polymer structure 440 as a medium. It should be noted that "connection" according to various embodiments disclosed herein may include all physical forms of connections, such as fastening, bonding, and assembly.

In an electronic device (e.g., 400 in FIG. 5) according to various embodiments disclosed herein, since the rear plate 411 or the side member 418 is in contact with the polymer structure 440, a larger contact area therebetween may be advantageous for maintaining high bonding strength.

In an electronic device (e.g., 400 in FIG. 5) according to various embodiments disclosed herein, a preformed plate (or a raw material) of a product for forming the housing may be manufactured to be thin (about 1.2 mm). According to various embodiments, when a preformed plate (or a raw material) is manufactured to be thin, the contact area between the rear plate 411 and the polymer structure 440 or between the side member 418 and the polymer structure 440 is narrowed, and thus the bonding strength may be lowered.

Figure 8:
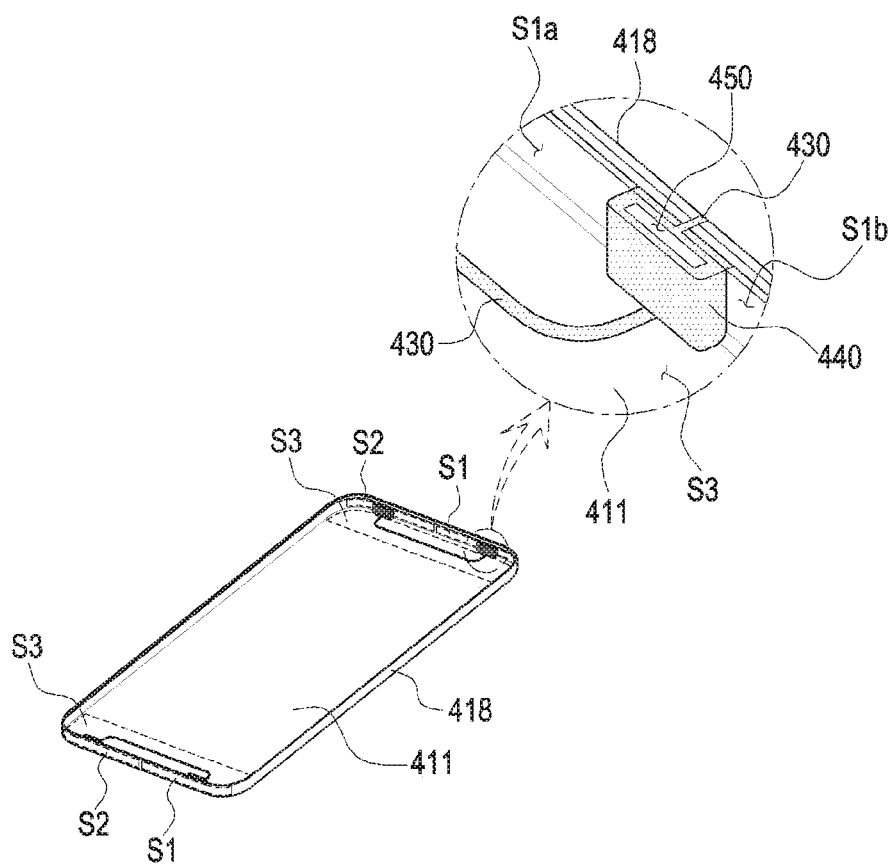
FIG. 8 illustrates a perspective view of an internal structure of an electronic device including a conductive piece according to various embodiments disclosed herein and an enlarged view of a portion of the internal structure.

FIG. 8 illustrates a perspective view of an internal structure of an electronic device (e.g., 400 in FIG. 5) including a conductive piece 450 according to various embodiments disclosed herein and an enlarged view of a portion of the internal structure.

According to various embodiments of the disclosure, the electronic device (e.g., 400 in FIG. 5) may include at least one conductive piece 450. According to an embodiment, a polymer structure 440 may be coupled to a housing of an electronic device (e.g., 400 in FIG. 5) (e.g., a polymer structure may be coupled by being injection-molded in the mold of the housing). The coupling force between the housing and the polymer structure 440 may vary depending on the area where the polymer structure 440 is in contact with the housing. When the conductive piece 450 is used, it is possible to increase the area where the polymer structure 440 is in contact with the housing, and thus it is possible to improve bonding strength. When a slit (e.g., 420 in FIG. 5) is formed so as to use the housing of the electronic device 400 as an antenna, the rigidity of the segment portion or the entire product having the slit (e.g., 420) formed therein may be deteriorated. By providing the conductive piece 450, the bonding strength of the segment portion formed by the slit (e.g., 420) can be improved.

According to various embodiments, the conductive piece 450 may be provided to correspond to the position where the slit (e.g., 420) is formed. According to an embodiment, the conductive piece 450 may be provided to correspond to the position where the slit 420 formed in the side member 418 is formed among various slits (e.g., 420) formed in the electronic device (e.g., 400 in FIG. 5).

According to various embodiments of the disclosure, the conductive piece 450 may be formed from a hemming structure using a preformed plate in the process of forming the side member 418. The conductive piece 450 according to various embodiments of the disclosure may be at least partially mounted inside the polymer structure 440. According to an embodiment, wording "the conductive piece 450 is at least partially mounted inside the polymer structure 440" may mean that the polymer structure 440 encloses the circumference of at least a portion of the conductive piece 450. According to various embodiments disclosed herein, as illustrated in FIG. 8, the polymer structure 440 can enclose at least four surfaces of the conductive piece 450. According to another embodiment (see, e.g., FIG. 28), the polymer structure 440 may surround at least three surfaces of the conductive piece 450. According to various embodiments, one conductive piece 450 may be included inside the polymer structure 440, and according to embodiments, a plurality of conductive pieces 450 may be included inside the polymer structure 440. Referring to FIG. 8, according to an embodiment disclosed herein, one conductive piece 450 may be disposed inside the polymer structure 440. It should be noted that the state in which the conductive piece 450 is disposed inside the polymer structure 440 is not limited to that shown in the drawing, and may be changed as various embodiments. For example, in another embodiment, a plurality of conductive pieces 450 (e.g., two conductive pieces 450 in FIG. 28) disposed inside the polymer structure 440 may be illustrated. Such embodiments may be implemented by using a method of insert injection-molding the polymer structure 440 in a mold provided with the conductive pieces 450.

According to various embodiments disclosed herein, the housing may serve as an antenna. According to various embodiments, at least a portion of the side member 418 or at least a portion of the side member 418 and the rear plate 411 may be formed of a conductive material (e.g., metal) so as to implement a function as an antenna. According to an embodiment, at least a portion of the conductive piece 450 may also be formed of a conductive material (e.g., metal). In addition, the conductive piece 450 may also be included in some of the components that implement the antenna function. According to an embodiment, the rear plate 411, the side member 418, or the conductive piece 450 may be made of a conductive material (e.g., metal) so as to implement a function as an antenna, in which case the electrical connection may be limited using the polymer structure 440 including an insulating material. The electrical connection may be limited by processing the inner surface of the rear plate 411, the inner surface of the side member 418, or various components mounted in the electronic device (e.g., 400 in FIG. 5). However, the polymer structure 440 may be used so as to limit the electrical connection between the conductive piece 450, the rear plate 411, and the side member 418.

According to various embodiments disclosed herein, the slit 420 may extend from a first portion of the side member 418 to a third portion of the side member 418 through a second portion of the rear plate 411. According to an embodiment, when the housing of the electronic device (e.g., 400 in FIG. 5) is formed of a conductive material, at least a portion of the housing may have a segmented shape (e.g., a segment portion) due to the slit 420. When the segment portion may be filled with a non-conductive material, the electronic device housing may be partially insulated.

According to various embodiments, the first portion and the third portion may be two of a plurality of areas separated from each other in the side member 418. According to various embodiments, the second portion may be one of a plurality of areas separated from each other in the rear plate 411. In various embodiments, the plurality of areas separated from each other may be virtually set areas.

According to various embodiments disclosed herein, a slit (e.g., 420) may be included in the first portion of the side member 418 and the third portion of the side member 418. According to various embodiments disclosed herein, the first portion and the third portion may belong to any one of the divided areas included in the side member 418. According to various embodiments, the slit 420 may be additionally included in the second portion of the rear plate 411. The second portion may belong to any one of the divided regions included in the rear plate 411. According to various embodiments, a plurality of virtual areas may be set in the housing. According to various embodiments disclosed herein, for example, as illustrated in FIG. 8, areas S1 and S2 may be set in the side member 418, and an area S3 may be set in the rear plate 411.

According to an embodiment, the first portion of the side member 418 may be included in the area S1, and the third portion of the side member 418 may be included in the area S2. According to an embodiment, the third portion of the rear plate 411 may be included in the area S3. According to various embodiments, since the slit 420 may pass through the first portion, the second portion, or the third portion, the wording "a portion is included in an area (e.g., the first portion is included in the area S1)" may mean that the slit (e.g., 420) passes through the corresponding area. According to an embodiment, the slit (e.g., 420) may be formed to extend through the corresponding area.

According to an embodiment, the first portion (e.g., the area S1) may be divided into a (1-1)th portion (e.g., an area S1a) and a (1-2)th portion (e.g., an area S1b). Although not separately illustrated in the drawings, the second portion (e.g., the area S2) may also be divided into a (2-1)th portion (e.g., S2a) and a (2-2)th portion (e.g., S2b). According to an embodiment, the first portion (e.g., the area S1) may be divided into a (1-1)th portion (e.g., an area S1a) and a (1-2)th portion (e.g., an area S1b) by the slit (e.g., 420a).

According to various embodiments, the areas S1, S2, and S3 may be formed on upper and lower portions of the housing of the electronic device (e.g., 400 in FIG. 5), respectively. A plurality of virtual areas according to various embodiments disclosed herein may be set in various ways in addition to the areas S1, S2, and S3. According to various embodiments, the first portion, the second portion, and the third portion of the side member 418 may respectively correspond to any area among the areas that are further subdivided than those of FIG. 8. The areas illustrated in FIG. 8 are merely an example and are not necessarily limited thereto.

The conductive piece 450 may be disposed at a position where the slit (e.g., 420) is formed so as to form a segment portion. For example, an imaginary line extending in the vertical direction through the center of the conductive piece 450 may be adjacent to or parallel to the slit (e.g., 420) formed in the side member 418. According to an embodiment, the conductive piece 450 may be formed in a bilaterally symmetrical structure about the slit (e.g., 420).

According to an embodiment, a plurality of conductive pieces 450 may be provided on one surface (e.g., the top surface) of the side member 418. According to an embodiment, as illustrated in FIG. 8, on the top surface of the side member 418, two conductive pieces 450 may be disposed in the first portion (e.g., the area S1) and the third portion (e.g., the area S2).

According to various embodiments disclosed herein, as illustrated in FIG. 8 in an enlarged scale, the injection-molded polymer structure 440 may be connected to at least a portion of the first portion (e.g., the area S1) of the side member 418 and at least a portion of the second portion (e.g., the area S3) of the rear plate 411 and at least a portion of the slit 420. According to an embodiment, the polymer structure 440 on which the conductive piece 450 is disposed may be connected to at least a portion of the third portion (e.g., the area S2) of the side member 418 and at least a portion of the second portion (e.g., the area S3) of the rear plate 411, and at least a portion of the slit 420.

When the conductive piece 450 is used, even if a preformed plate is manufactured to be thin, the bonding area between the rear plate 411 and the polymer structure 440 or the bonding area between the side member 418 and the polymer structure 440 can be sufficiently secured. Thus, it is possible to manufacture an electronic device (e.g., 400) having high durability.

Figure 10:
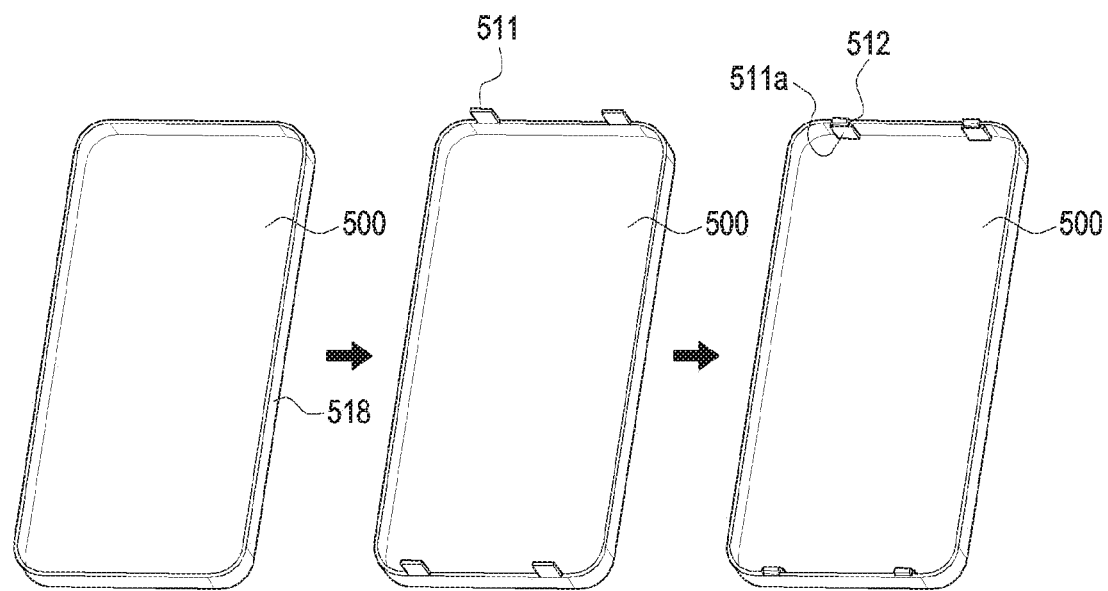
FIG. 10 is a view illustrating an electronic device housing according to various embodiments disclosed herein, in which hemming structures are formed through pressing and trimming.
Figure 11:
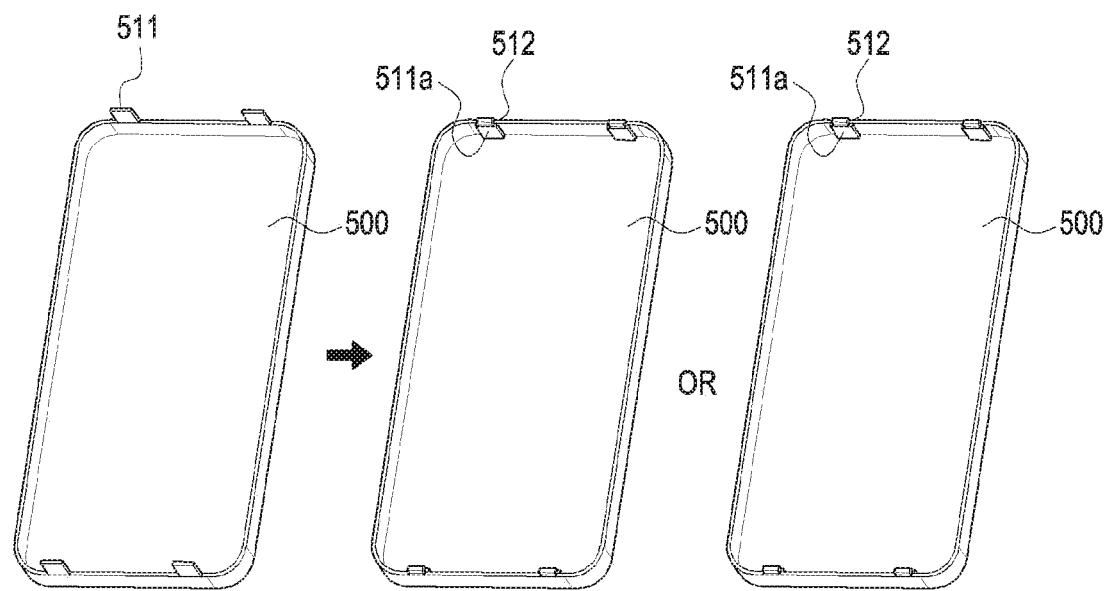
FIG. 11 is a view illustrating an electronic device housing according to various embodiments disclosed herein, in which hemming structures are formed only through pressing.

FIGS. 9A and 9B are views illustrating a housing of an electronic device (e.g., 400 in FIG. 5) according to various embodiments disclosed herein, in which hemming structures 511a are formed on a preformed plate 500. FIG. 10 is a view illustrating a housing of an electronic device (e.g., 400 in FIG. 5) according to various embodiments disclosed herein, in which hemming structures 511a are formed through pressing and trimming. FIG. 11 is a view illustrating a housing of an electronic device (e.g., 400 in FIG. 5) according to various embodiments disclosed herein, in which hemming structures 511a are formed only through pressing.

Hereinafter, a process of forming a hemming structure 511a of a housing of an electronic device (e.g., 400 in FIG. 5) according to various embodiments disclosed herein will be described with reference to FIGS. 9 to 11.

Figure 9:
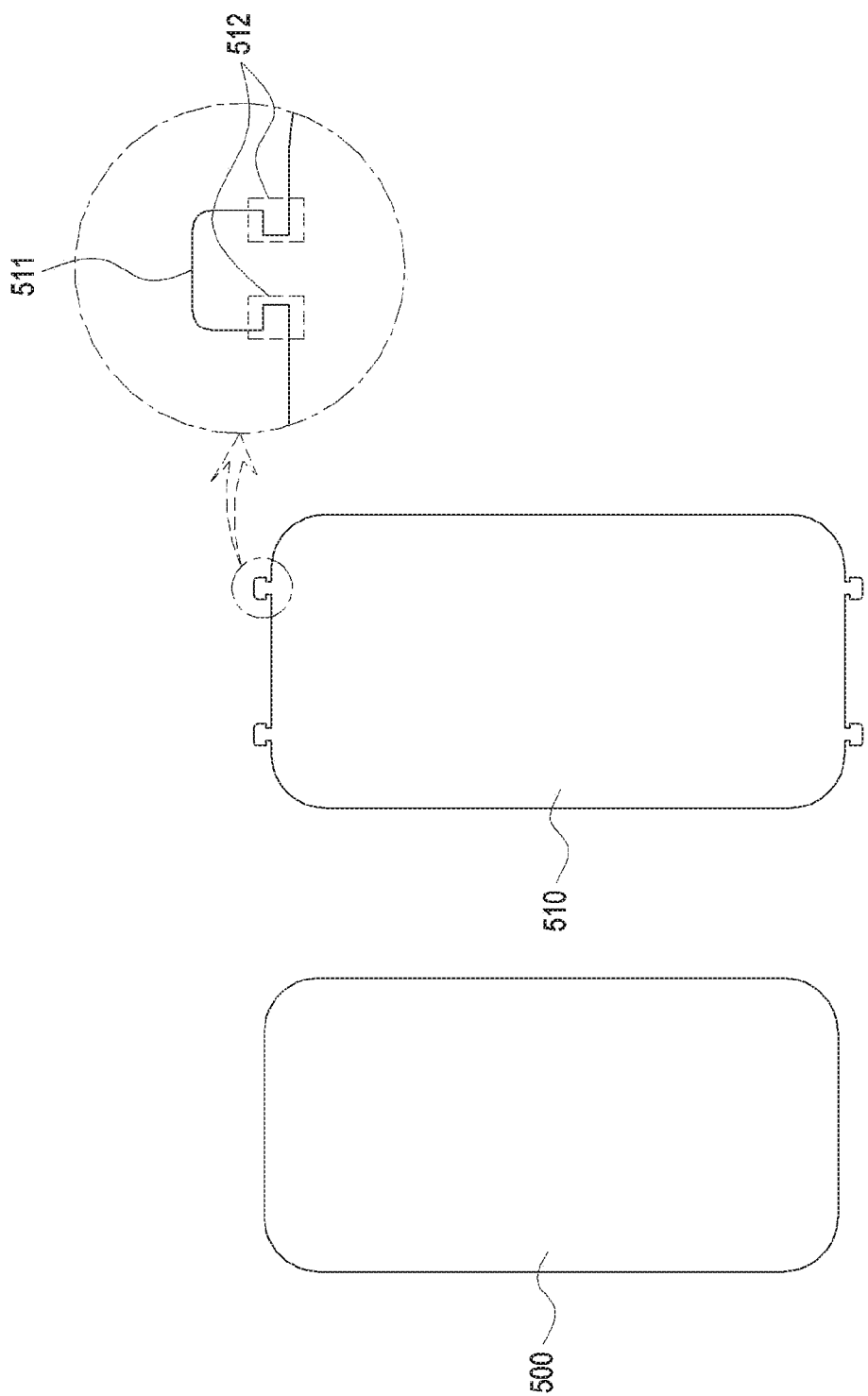
FIGS. 9A and 9B are views illustrating an electronic device housing according to various embodiments disclosed herein, in which hemming structures are formed on a preformed plate.

Referring to FIG. 9, a generally flat preformed plate 500 (or a raw material) may be prepared. According to various embodiments disclosed herein, the rear plate (e.g., 411) and the side member (e.g., 418) of the electronic device (e.g., 400 in FIG. 5) may be integrally formed. Thus, the preformed plate 500 (or the raw material) may have a surface area equal to or larger than the sum of the widths of the rear plate (e.g., 411) and the side member (e.g., 418).

According to various embodiments disclosed herein, hemming portions 511 may be formed by processing an edge of a flat preformed plate (or a raw material) 500. The hemming portions 511 may have various forms according to various embodiments of an electronic device (e.g., 400 in FIG. 5) to be manufactured, and the position and/or number of hemming portions 511 are not limited to those illustrated in the drawings, and may be variously set.

According to various embodiments disclosed herein, a notch portion 512 may be formed at a boundary between each hemming portion 511 and the preformed plate (or a raw material) 500. The notch portions 512 may serve to facilitate bending in the pressing process. According to various embodiments disclosed herein, first hemming portions 511 may be formed in a preformed plate (a raw material) 500, and then the preformed plate 500 may be shaped by being put into a press mold. Alternatively, a preformed plate (the raw material) 500 may be shaped by being put into a press mold, and then hemming portions 511 may be formed.

Referring to FIG. 10, hemming structures 511a may be formed on a housing of an electronic device (e.g., 400 in FIG. 5) according to an embodiment using a trimming process and a pressing process. In forming the hemming structures 511a, a trimming process and two or more pressing processes may be combined. For example, a preformed plate (or a raw material) 500 is first pressed (primary pressing) so as to bend the edges of the preformed plate 500 by about 90 degrees. When the edges of the preformed plate 500 are bent by about 90 degrees to form the side member 518, then, hemming portions 511 may be formed through a trimming process. In addition, the hemming portions 511 may be directed toward the preformed plate 500 through a pressing (secondary pressing) process of bending the hemming portions 511 again by about 90 degrees. As a result, hemming structures 511a facing the side member 518 may be formed.

Referring to FIG. 11, on a housing of an electronic device (e.g., 400 in FIG. 5) according to an embodiment, hemming structures 511a may be formed only through a pressing process without a trimming process. According to an embodiment, the hemming structures 511a may be preformed by performing primary pressing and secondary pressing in the state where the hemming portions 511 are first formed on the preformed plate (or the raw material) 500, as illustrated in the drawing on the left side of FIG. 11. In addition, according to an embodiment, as illustrated in the drawing on the right figure of FIG. 11, the hemming structures 511a may be formed only through primary pressing in the state in which the hemming portions 511 are formed on the preformed plate 500.

The process of forming the hemming structures described above are related to some embodiments included in a method of manufacturing a housing of an electronic device according to various embodiments disclosed herein, and it should be noted that the technical scope disclosed herein is not limited to the previously introduced embodiments.

Figure 12:
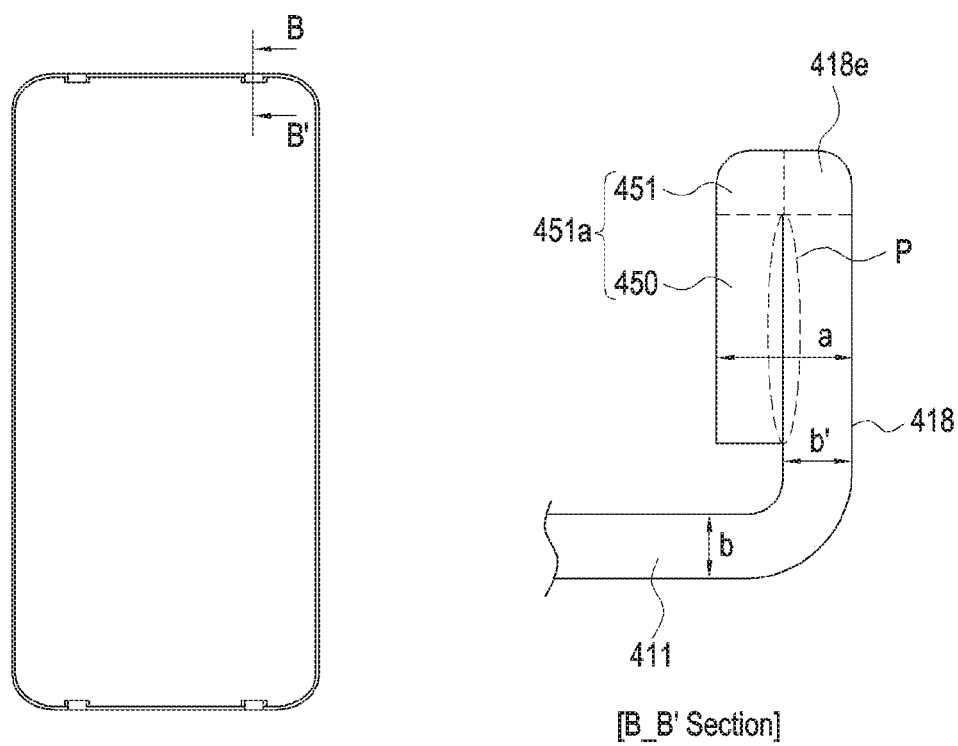
FIG. 12 is a cross-sectional view illustrating a side member and a hemming structure in a housing of an electronic device housing according to various embodiments disclosed herein.
Figure 13:
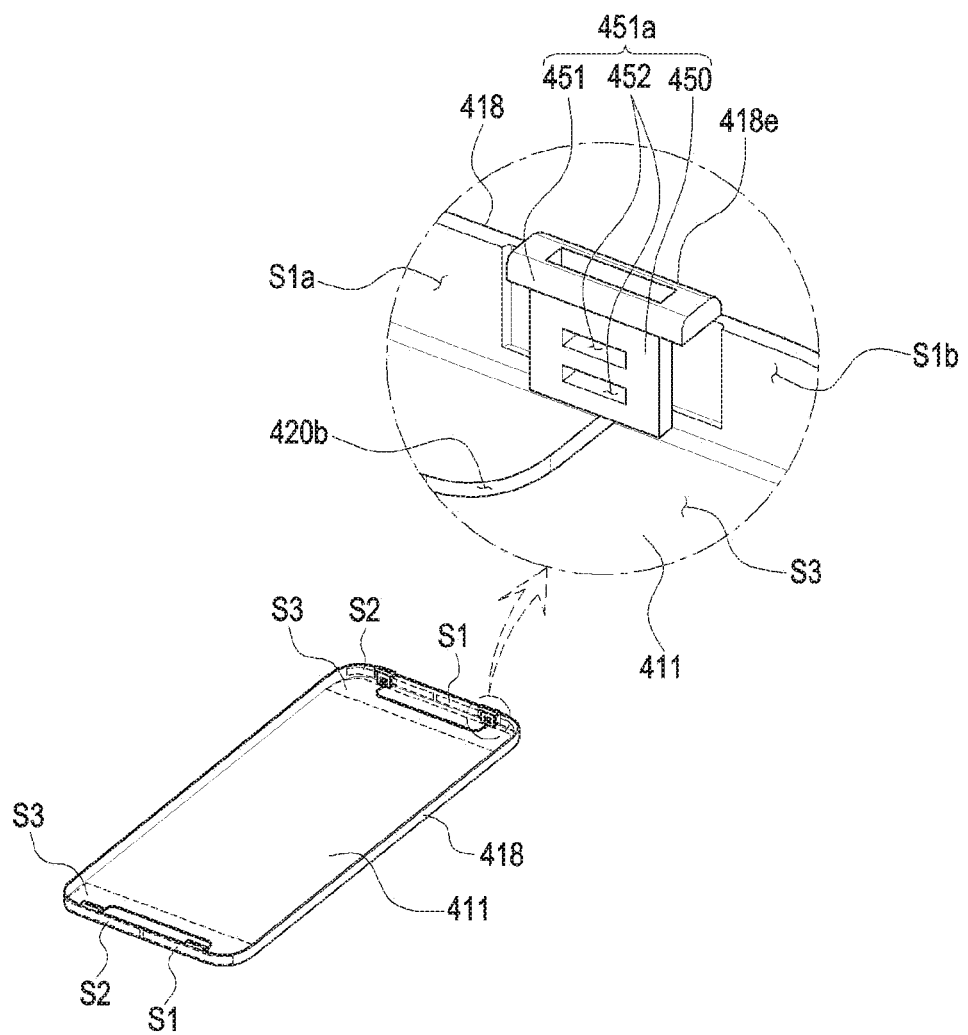
FIG. 13 is a perspective view illustrating a rear plate, a side member, and a hemming structure in a housing of an electronic device according to various embodiments disclosed herein.
Figure 14:
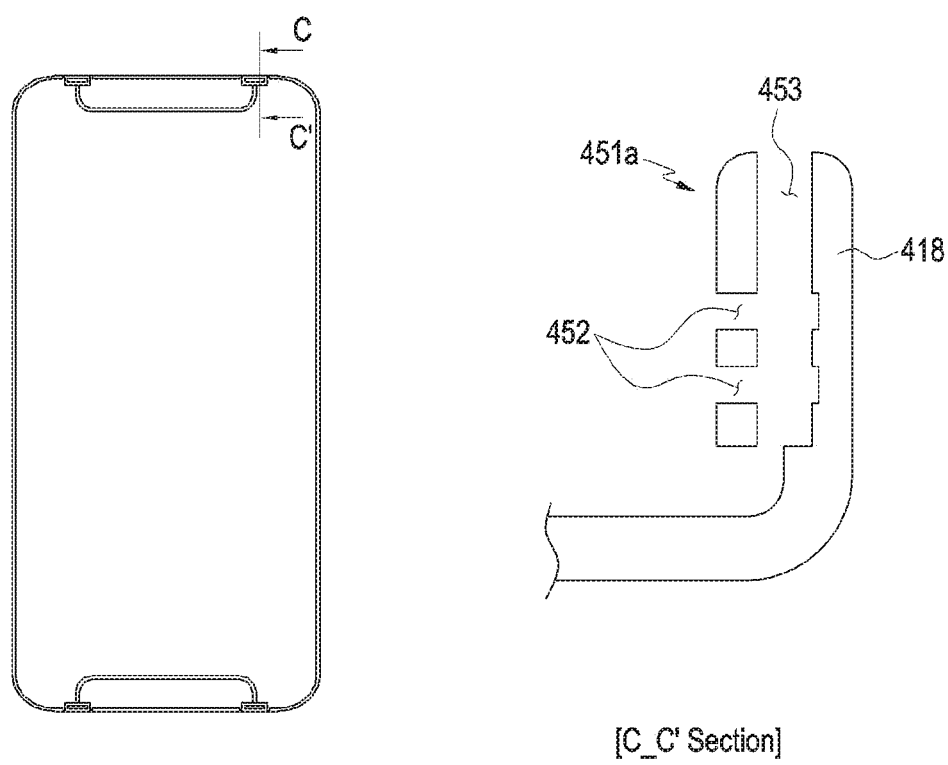
FIG. 14 is a cross-sectional view illustrating the state in which grooves and a space are formed in a hemming structure in a housing of an electronic device according to various embodiments disclosed herein.
Figure 15:
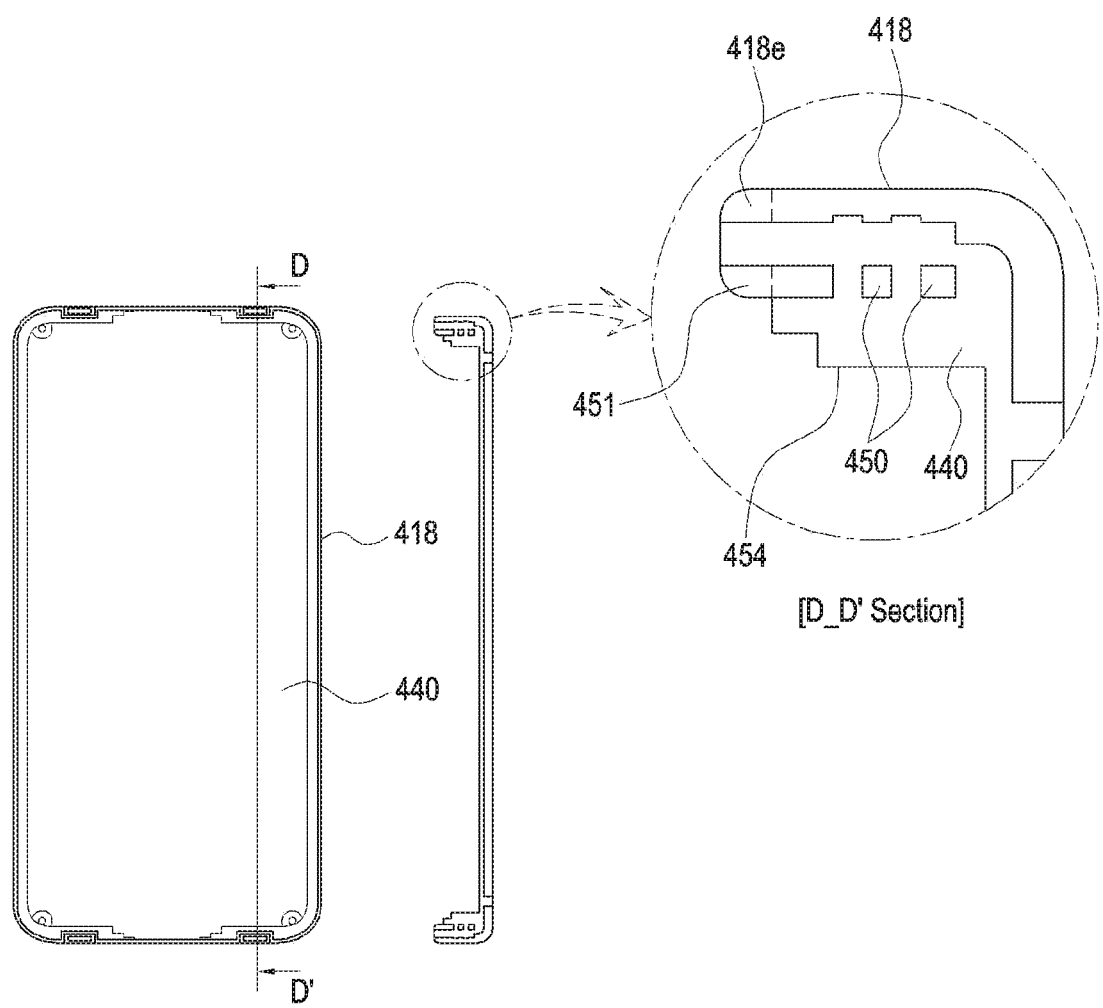
FIG. 15 is a view illustrating the state in which a hemming structure and a polymer structure are coupled to each other in a housing of an electronic device according to various embodiments disclosed herein.
Figure 16:
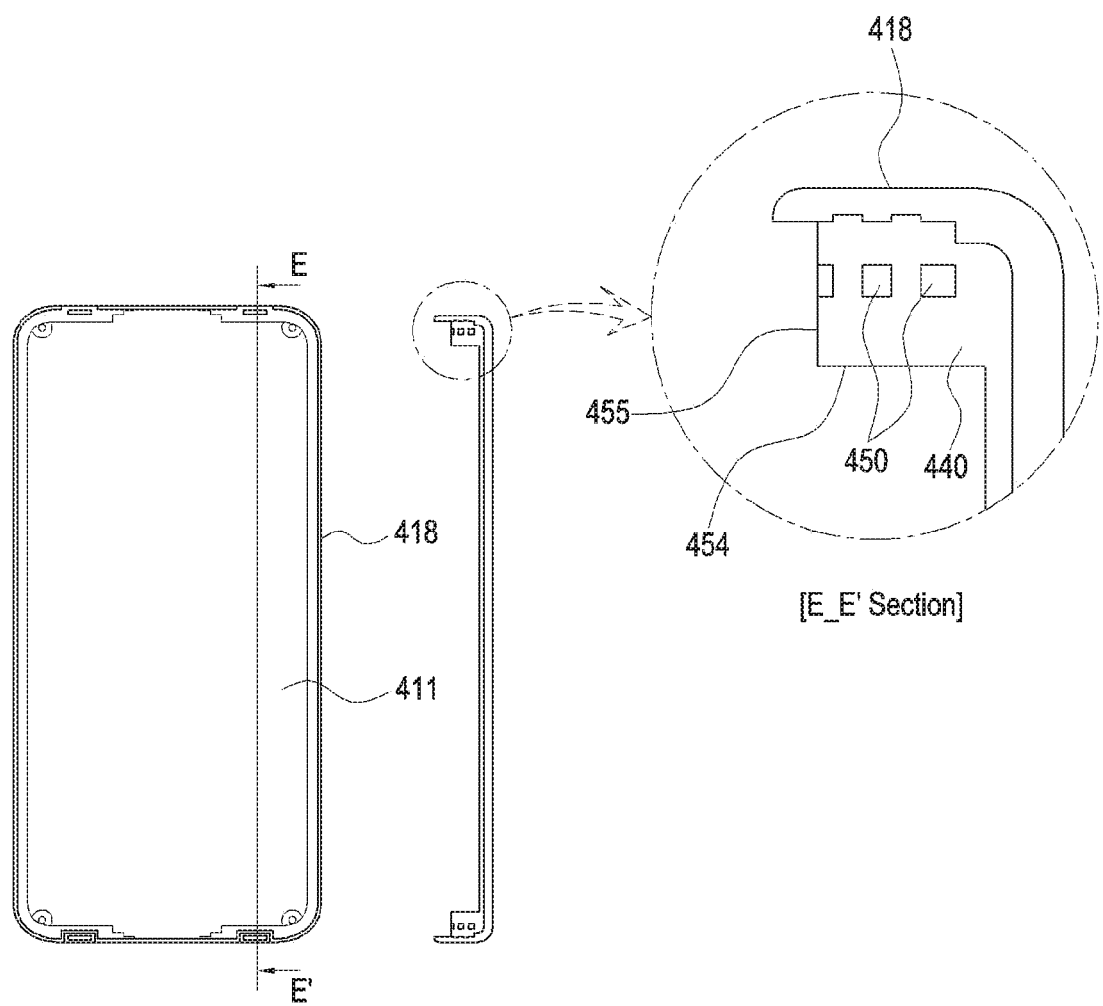
FIG. 16 is a cross-sectional view illustrating the state in which a configuration in which a hemming structure and a polymer structure are coupled to each other is trimmed in a housing of an electronic device according to various embodiments disclosed herein.

FIG. 12 is a cross-sectional view illustrating a side member 418 and a hemming structure 451a in a housing of an electronic device (e.g., 400 in FIG. 5) according to various embodiments disclosed herein. FIG. 13 is a cross-sectional view illustrating a rear plate 411, a side member 418, and a hemming structure (e.g., 451a in FIG. 12) in a housing of an electronic device (e.g., 400 in FIG. 5) according to various embodiments disclosed herein. FIG. 14 is a cross-sectional view illustrating the state in which grooves 452 and a space 453 are formed in a hemming structure 451a in a housing of an electronic device (e.g., 400 in FIG. 5) according to various embodiments disclosed herein. FIG. 15 is a view illustrating the state in which a hemming structure 451a and a polymer structure 440 are coupled to each other in a housing of an electronic device (e.g., 400 in FIG. 5) according to various embodiments disclosed herein. FIG. 16 is a cross-sectional view illustrating the state in which a configuration in which a hemming structure 451a and a polymer structure 440 are coupled to each other is trimmed in a housing of an electronic device (e.g., 400 in FIG. 5) according to various embodiments disclosed herein.

Referring to FIGS. 12 and 13 together, a conductive piece 450 according to various embodiments disclosed herein may be formed on the basis of a hemming structure 451a. According to various embodiments, the hemming structure 451a may be formed by bending inwards a portion of an edge of a housing constituting the outer shape of an electronic device (e.g., 400 in FIG. 5). According to various embodiments, the hemming structure 451a may be a portion including a conductive piece 450 and a first bent portion 451 on the top of the conductive piece 450. Accordingly, the conductive piece 450 may have a configuration obtained by removing the first bent portion 451 from the hemming structure 451a. According to an embodiment, the hemming structure 451a may be formed to have a bilaterally symmetrical structure about a slit (e.g., 420a) formed in the side member 418. According to various embodiments disclosed herein, a polymer structure (e.g., 440) may be formed by forming the hemming structure 451a at a position corresponding to the slit 420 formed in the first portion (e.g., S1) or the second portion (e.g., S2), and injection-molding (e.g., insert injection molding) polymer in a mold for a housing including the hemming structure 451a.

According to an embodiment disclosed herein, a hemming portion (e.g., 511 in FIG. 10) is formed on a portion of the housing, and then the hemming portion (e.g., 511 in FIG. 10) is bent to form the hemming structure 451a. As described above with reference to FIGS. 9 to 11, the hemming portion (e.g., 511 of FIG. 10) may be formed through a trimming or pressing process. According to various embodiments, the hemming structure 451a may be in close contact with the inner surface of the side member 418 or may be spaced apart from the inner surface of the side member 418.

As an embodiment, FIG. 12 illustrates the hemming structure 451, which is in close contact with the inner surface of the side member 418 after the hemming portion is bent inwards. According to this, at least a portion of the hemming structure 451a and at least a portion of the side member 418 may have surfaces (or inner surfaces) facing each other.

The side member 418 according to an embodiment disclosed herein may include a second bent portion 418e extending from the side member 418. As will be described later, the first bent portion 451 and the second bent portion 418e disclosed herein may be removed in a process of processing the electronic device (e.g., trimming). According to various embodiments, at least a portion of the conductive piece 450 including the first bent portion 451 and at least some components of the side member 418 including the second bent portion 418e may be removed through a process of processing the electronic device (e.g., trimming).

Referring to FIG. 12, according to various embodiments disclosed herein, the side portion of the housing may include a portion in which a hemming structure 451a is formed and a portion in which only the side member 418 is formed without a hemming structure 461a. Accordingly, the thickness of the side portion of the housing may correspond to the thickness b' of the side member 418 or the thickness including the thicknesses of the side member 418 and the hemming structure 451a, and the thickness including the thicknesses of the side member 418 and the hemming structure 451a may be the maximum thickness a of the side portion of the housing. According to an embodiment, the preformed plate (e.g., 500 in FIG. 10) is pressed in the manufacturing process of the electronic device to produce the rear plate 411 and the side member 418. Thus, the thickness b' of the side member 418 and the thickness b of the preformed plate (e.g., 500) may be substantially the same. According to various embodiments, the maximum thickness a of the side portion of the housing can be made smaller than that illustrated in FIG. 12 through processing of the side portion of the housing. According to an embodiment, a spring-back phenomenon may be prevented by making the maximum thickness a of the side portion of the housing smaller than twice the thickness b' of the side member 418 through a method of bringing the hemming structure 451a into close contact with the side member 418 using a mold not shown in the drawings.

The hemming structure 451a according to various embodiments disclosed herein may have various shapes. For example, as illustrated in FIG. 13, one or more grooves 452 may be provided, and the shape and the width of the cross section thereof may be variously set. As will be described later, a predetermined space 453 may also be formed between the hemming structure 451a and the side member 418.

Referring to FIG. 13, in a housing of an electronic device (e.g., 400) according to various embodiments disclosed herein, one hemming structure 451a may be formed using one hemming portion (e.g., 511 in FIG. 10) made from the side member 418. However, this is merely an example, and two or more hemming structures 451a may be formed using one hemming portion, or a plurality of hemming structures 451a may be formed using a plurality of hemming portions. For example, two hemming structures (e.g., 451a) may be formed as will be described later with reference to FIG. 23 by forming one hemming portion (e.g., 511 in FIG. 10) and forming a slit (e.g., 420) to the side member 418 including the hemming portion. As another example, although not illustrated in the drawings, different hemming structures (e.g., 451a) may be formed using different hemming portions (e.g., 420). According to various embodiments disclosed herein, as illustrated in FIG. 13, a slit (e.g., 420a) is formed in a first portion (e.g., S1), and a hemming structure 451a is formed to correspond to a position where the slit (e.g., 420a) is formed. The hemming structure 451a may be formed to face at least a portion of a (1-1)th portion S1a and at least a portion of a (1-2)th portion S1b.

Hereinafter, for convenience of description, one hemming structure 451a formed in the first portion S1 may be mainly described.

According to various embodiments, as illustrated in FIGS. 13 and 14, the surface portions (or the inner surfaces) facing each other in the hemming structure 451a and the side member 418 may be processed. Through this, a plurality of grooves 452 may be formed in the inner surface of the side member 418. In addition, a polymer structure 440 may be inserted into the grooves 452 as illustrated in FIG. 15. When a conductive piece 450 based on the hemming structure 451a is used, an effect of partially increasing the thickness of the side member 418 can be obtained.

Referring to FIG. 14, the hemming structure 451a and the side member 418 according to an embodiment may be spaced apart from each other when viewed in a cross section so as to form a predetermined space 453 therebetween. By using the space 453, the antenna area and the non-antenna area can be separated from each other. According to an embodiment, the space 453 may be used together with a slit (e.g., 420) so as to separate the antenna area from the non-antenna area.

When the space 453 is used, the contact area between a conductive material (e.g., metal) and a non-conductive material (e.g., insulator) may be increased. Referring to FIGS. 14 to 16 together, the polymer structure 440 according to various embodiments disclosed herein may surround the conductive piece 450 on at least three surfaces, and may also be located in the space 453, whereby the bonding force between the conductive material (e.g., metal) and the non-conductive material (e.g., insulator) can be increased.

As illustrated in FIG. 15, after injection-molding (e.g., insert injection-injecting) the polymer structure 440 into the mold of the housing in which the grooves 452 and the space 453 are formed, at least a portion of the first bent portion 451 and the polymer structure 440 adjacent to the first bent portion 451 may be removed through a CNC process (or trimming is also possible), in which case the shape illustrated in FIG. 16 may be obtained. For reference, as illustrated in FIGS. 15 and 16, the housing including the injection-molded polymer structure 440 may have a first inner surface 454 and a second inner surface 455 through the CNC process. The first inner surface 454 and the second inner surface 455 may form a surface on which mounting components inside the electronic device (e.g., 400) including the display device 160 (e.g., a display) are seated.

According to various embodiments described above, there is an advantage in that the maximum thickness of the side housing (e.g., a in FIG. 12) equal to or smaller than about 1.2 mm can be formed. Reducing the maximum thickness of the side housing may mean that the thickness of the corresponding preformed plate (e.g., 500 in FIG. 10) can be reduced, whereby a processing time and a processing amount for the electronic device (e.g., 400 in FIG. 5) can be reduced. Upon comparing FIGS. 15 and 16 with FIG. 7B, it can be seen that the contact area between the polymer structure 440 and the side member 418 is increased. Accordingly, according to an embodiment disclosed herein, by forming a conductive piece 450 using the hemming structure (e.g., 451a) and providing the plurality of grooves (e.g., 452) or the space (e.g., 453) therein, it is possible to secure a bonding force required between the polymer structure 440 and the side member 418 while forming the housing of the electronic device (e.g., 400 in FIG. 5) to be thin.

The polymer structure 440 according to various embodiments disclosed herein may be made of a non-electrically conductive material, which may be the same material as an insulating material (e.g., 430 in FIG. 5), which is a material filling the slit (e.g., 420 in FIG. 5). For example, the polymer structure may be formed of a polymer resin, which may be at least one of polyphenylene sulfide (PPS), polybutylene terephthalate (PBT), polyimide (PI), polycarbonate (PC), or acrylonitriyl butadiene styrene resin (ABS), and may include inorganic particles (ceramic, glass fiber, etc.) suitable for enhancing mechanical properties.

According to various embodiments disclosed herein, the rear plate 411 and the side member 418 are physically and/or chemically connected to each other by the insulating material 430, while at least a portion of the rear plate 411 and the side member 418 may be formed of an electrically conductive material and the insulating material 430 may be formed of a non-electrically conductive material. Thus, the rear plate 411 and the side member 418 may be electrically separated from each other.

According to other embodiments, the conductive piece 450 may be formed of the same material as the electrically conductive material of the rear plate 411 and the side member 418. For example, at least one of an aluminum alloy, a magnesium alloy, zinc alloy, a copper alloy, a titanium alloy, stainless steel, or an amorphous metal may be applied. According to an embodiment disclosed herein, the conductive piece 450 may be formed of aluminum so as to form a lightweight housing.

According to various embodiments, the conductive piece 450, the rear plate 411, and the side member 418 may include one or more different electrically conductive materials (e.g., metal). According to various embodiments, the materials of the conductive piece 450, the rear plate 411, and the side member 418 may include electrically conductive materials (e.g., metal) having different composition ratios for the same materials.

According to various embodiments disclosed herein, the electrically conductive material (e.g., metal) formed on the rear plate 411 and the side member 418 may constitute a substantial portion. According to an embodiment, the substantial portion of the rear plate 411 and the side member 418 may be separated into at least two portions by a slit (e.g., 420). At least one of the two portions divided from the substantial portions may function as an antenna.

Figure 17:
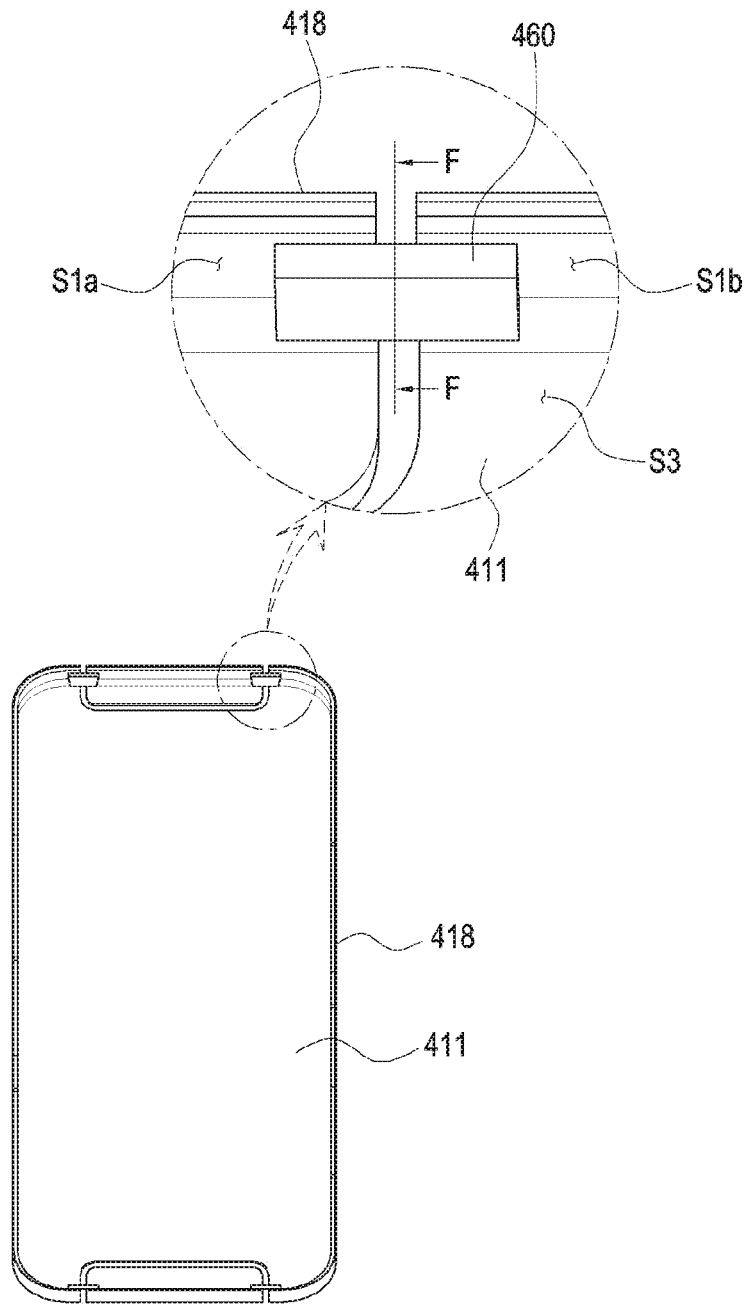
FIG. 17 is a view illustrating the state in which an electronic device according to various embodiments disclosed herein further includes a reinforcement metal.
Figure 18:
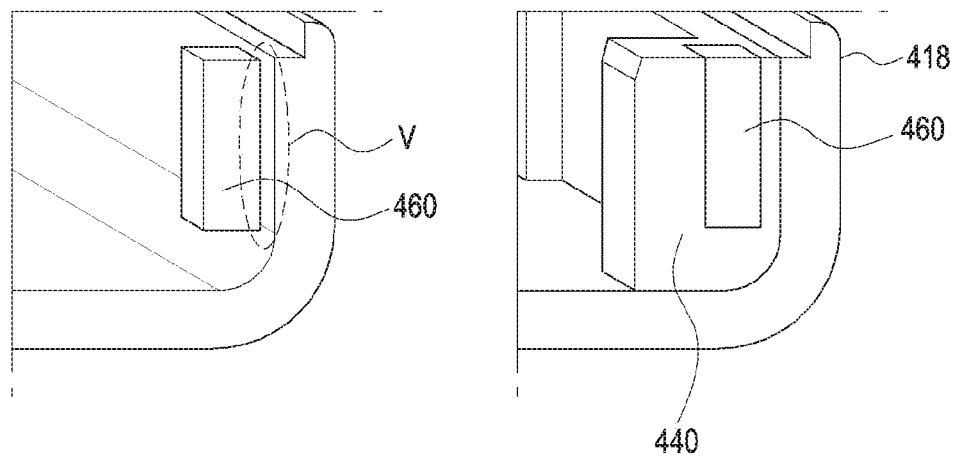
FIG. 18 is a view illustrating a cross section of a housing of an electronic device including a reinforcement metal according to various embodiments disclosed herein.

FIG. 17 is a view illustrating the state in which an electronic device (e.g., 400 in FIG. 5) according to various embodiments disclosed herein further includes a reinforcement metal 460. FIG. 18 is a view illustrating a cross section of a housing of an electronic device (e.g., 400 in FIG. 5) including a reinforcement metal 460 according to various embodiments disclosed herein.

An electronic device (e.g., 400 in FIG. 5) according to various embodiments disclosed herein may further include a reinforcement metal 460, as illustrated in FIGS. 17 and 18.

The reinforcement metal member 460 may be disposed to face the side member 418 similarly to a hemming structure (e.g., 451*a* in FIG. 14). However, unlike the hemming structure 451*a*, which is a component extending from the side member 418, the reinforcement metal member 460 may be an element provided separately from the side member 418.

According to an embodiment, during the process of pressing the hemming structure (e.g., 451*a* in FIG. 14), the distance (gap) between the hemming structure 451*a* and the side member 418 may deviate from a predetermined separation distance. According to various embodiments disclosed herein, the side member 418 may be used as an antenna. To this end, the distance (gap) may affect an antenna performance. Accordingly, according to various embodiments disclosed herein, the reinforcement metal member 460 may be used to keep the distance between the hemming structure 451*a* and the side member 418 or the distance between the hemming structure 451*a* and the slit (e.g., 420 in FIG. 5) constant. According to various embodiments, the hemming structure 451*a* may be used as the reinforcement metal member 460.

Figure 19:
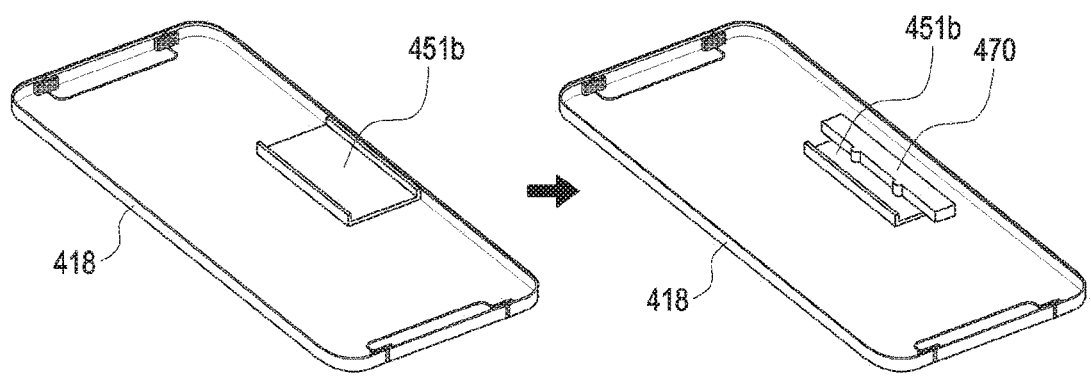
FIG. 19 is a perspective view illustrating a hemming structure used by being formed as a rib in an electronic device according to various embodiments disclosed herein.
Figure 20:
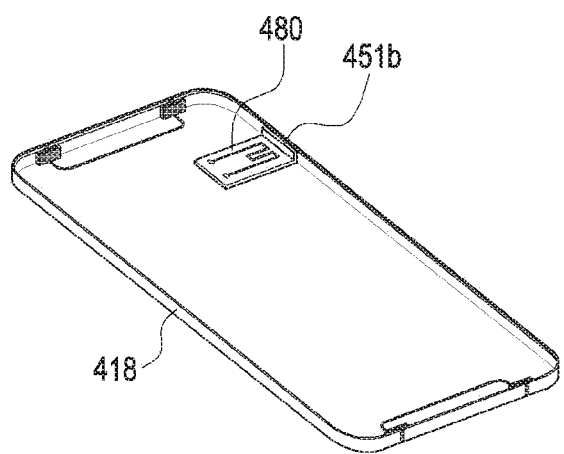
FIG. 20 is a perspective view illustrating an antenna pattern formed in a hemming structure in an electronic device according to various embodiments disclosed herein.
Figure 21:
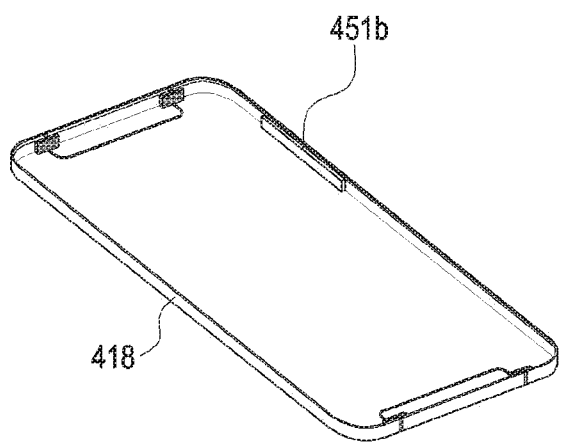
FIG. 21 is a perspective view illustrating a hemming structure used in a side key portion in an electronic device according to various embodiments disclosed herein.
Figure 22:
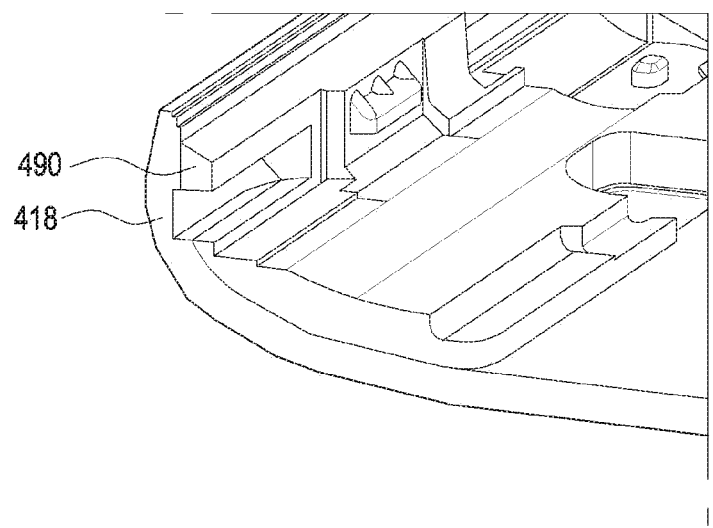
FIG. 22 is a cross-sectional perspective view illustrating a leg engagement portion of an electronic device according to various embodiments disclosed herein.

FIG. 19 is a perspective view illustrating a hemming structure 451*b* used by being formed as a rib in an electronic device (e.g., 400 in FIG. 5) according to various embodiments disclosed herein. FIG. 20 is a perspective view illustrating a hemming structure 451*b* having an antenna pattern 480 formed thereon in an electronic device (e.g., 400 in FIG. 5) according to various embodiments disclosed herein. FIG. 21 is a perspective view illustrating a hemming structure 451*b* used in a side key portion in an electronic device (e.g., 400) according to various embodiments disclosed herein. FIG. 22 is a cross-sectional perspective view illustrating a leg engagement portion 490 of an electronic device (e.g., 400 in FIG. 5) according to various embodiments disclosed herein.

Various application examples of a hemming structure 451*b* according to various embodiments disclosed herein may be described with reference to FIGS. 19 to 22.

Referring to FIG. 19, a hemming structure 451*b* used as a rib of an electronic device is illustrated. At least one hemming structure 451*b* may be formed to extend from the side member 418 of the housing so as to be provided in a flat structure on the top surface of the rear plate (e.g., 411). In this process, the hemming structure 451*b* may be formed on the rear plate (e.g., 411) rather than on the side member 418 using one or more injection-molded portions 470. Referring to FIG. 20, an electronic device (e.g., 400 of FIG. 5) according to various embodiments disclosed herein may have an antenna pattern 480 formed using the hemming structure 451*b* itself. According to this, the antenna pattern 480 of another embodiment, that is not an antenna structure segmented using a slit (e.g., 420 in FIG. 5), may be included inside the electronic device (e.g., 400). For example, the hemming structure 451*b* may be processed so as to form a pattern that can be used as an antenna, or materials constituting an antenna inside the housing including at least a portion of the hemming structure 451*b* may be deposited (through printing, plating, laser-processing, or the like) so as to form an antenna.

Referring to FIG. 21, in the electronic device (e.g., 400 in FIG. 5) according to various embodiments, a portion that lacks durability due to a hole formed therein, such as a side key portion, may be reinforced by using the hemming structure 451*b*. The side key illustrated in the drawing is merely an example, and the hemming structure 451*b* according to various embodiments disclosed herein may be used as reinforcement components (e.g., audio modules 203, 207, and 214) for another side member 418 not illustrated in the drawings.

Figure 23:
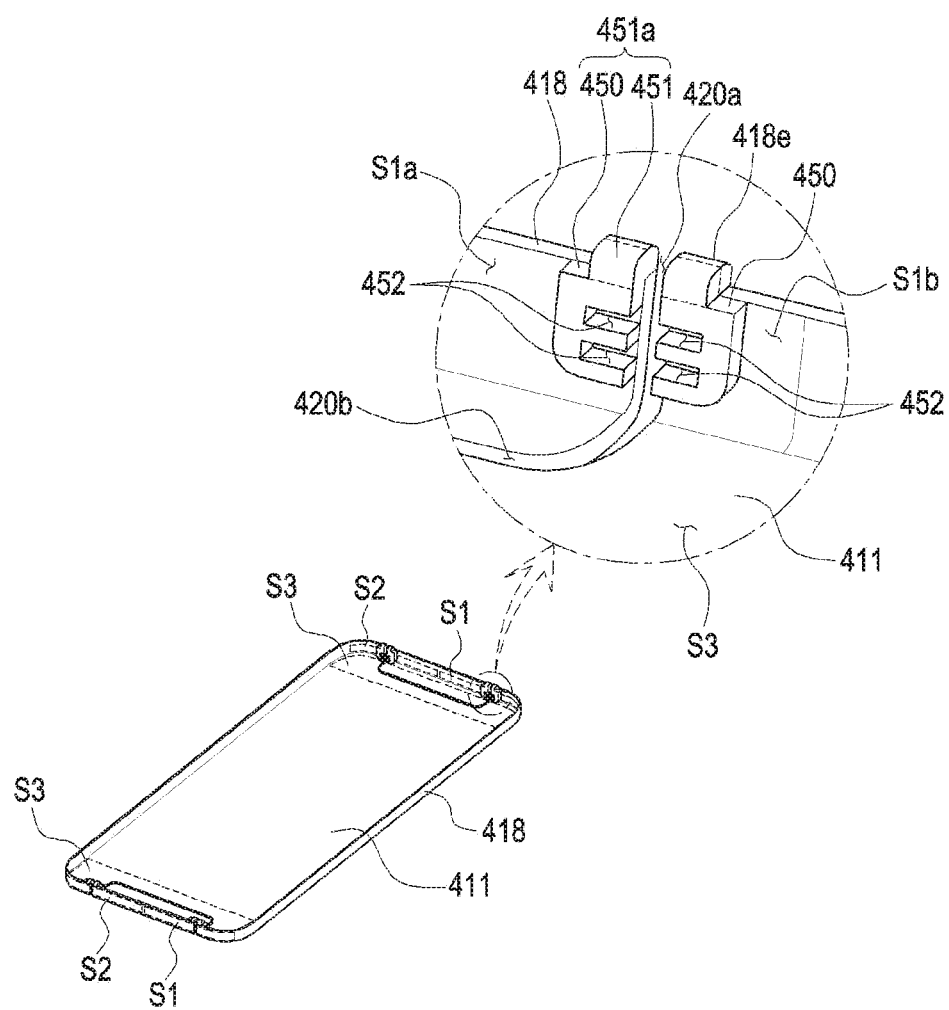
FIG. 23 is a perspective view illustrating a rear plate, a side member, and a hemming structure in a housing of an electronic device according to another embodiment disclosed herein.
Figure 24:
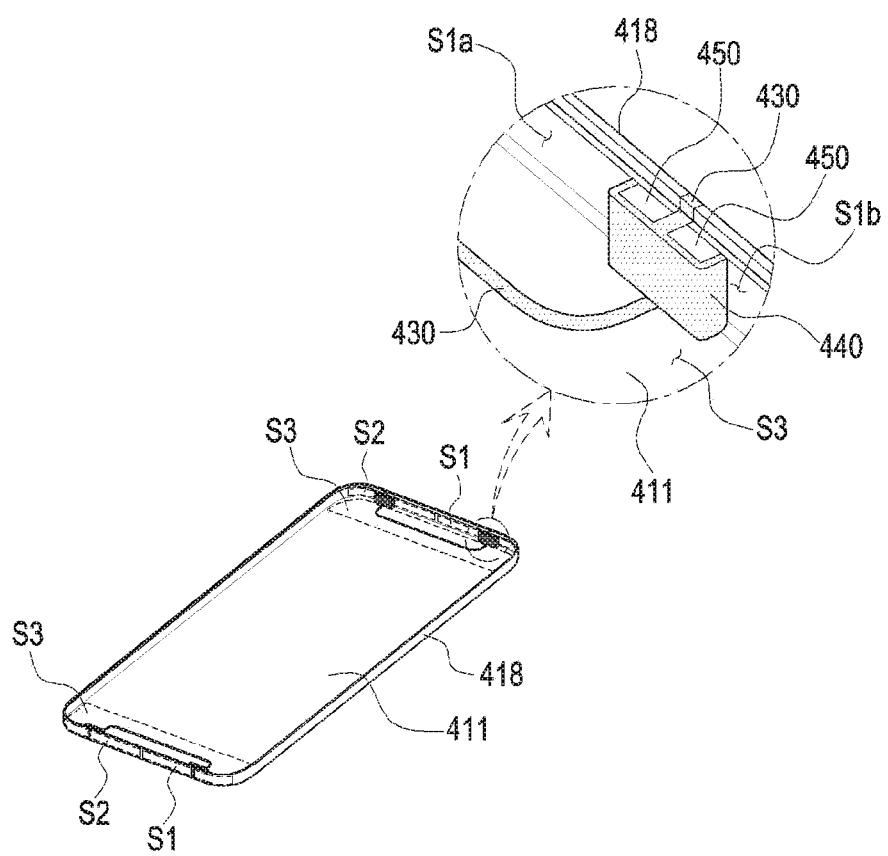
FIG. 24 illustrates a perspective view of an internal structure of an electronic device including a conductive piece according to another embodiment disclosed herein and an enlarged view of a portion of the internal structure.
Figure 25:
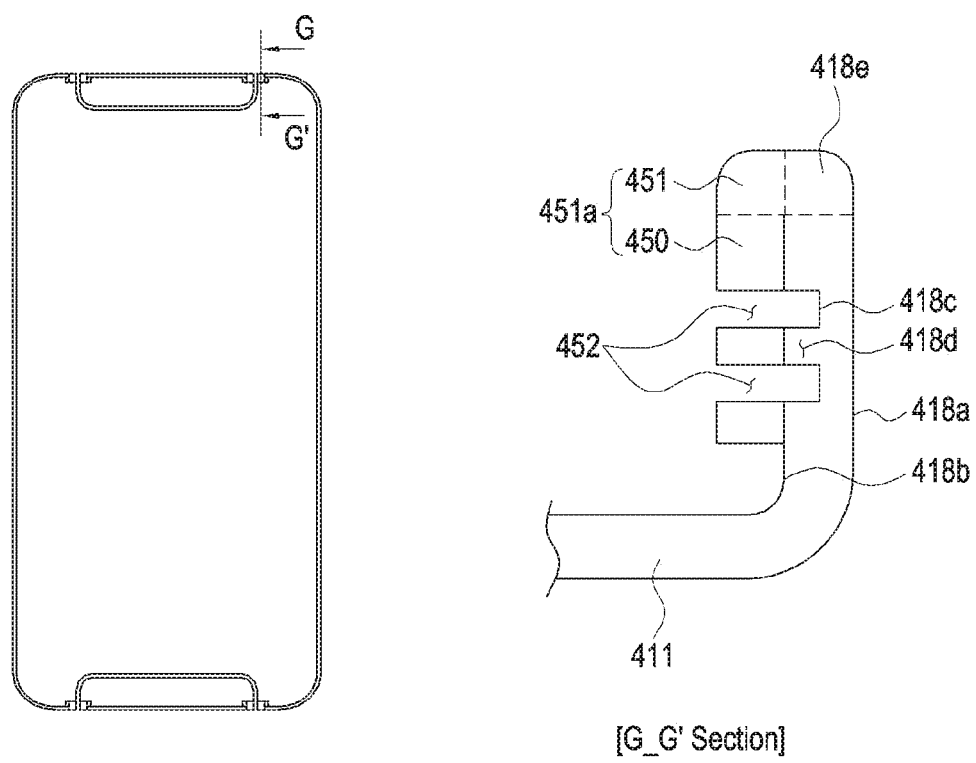
FIG. 25 is a cross-sectional view illustrating the state in which grooves are formed in a side member of a hemming structure according to another embodiment disclosed herein.
Figure 26:
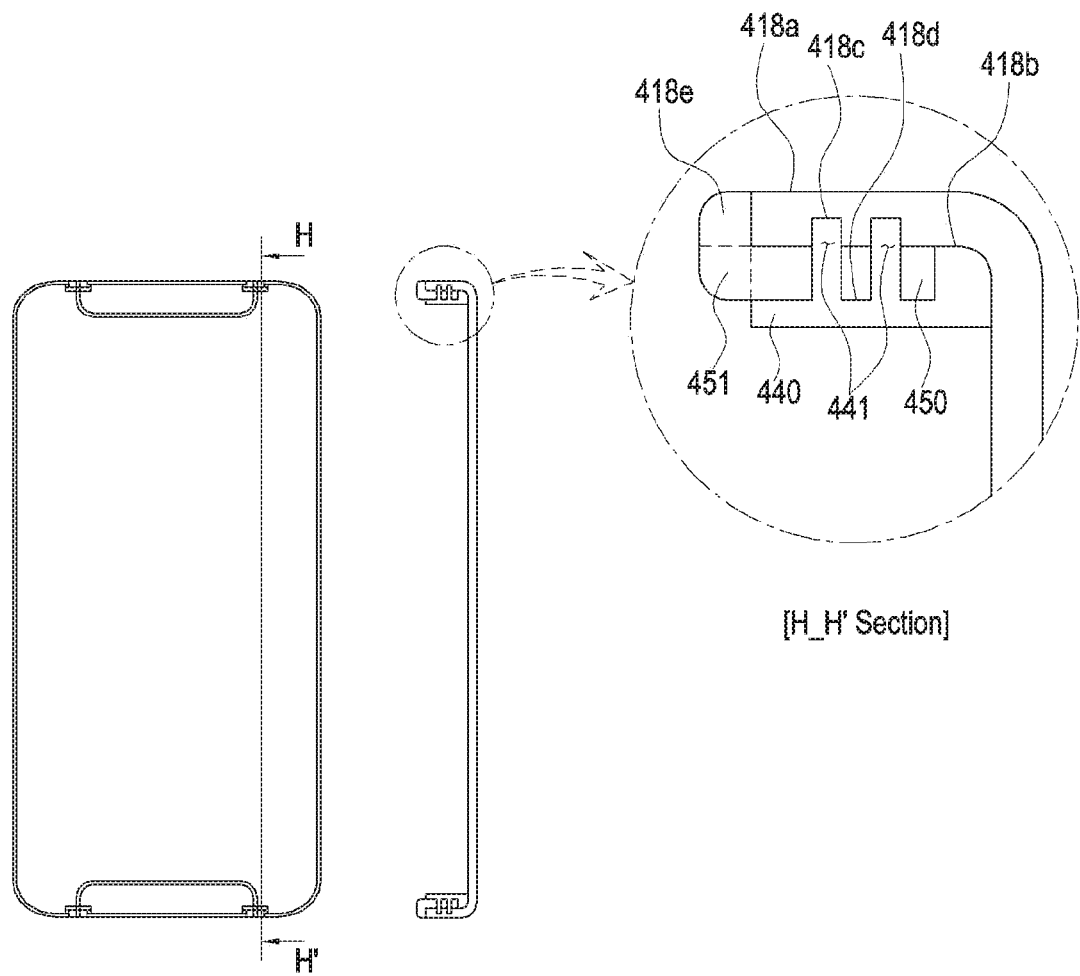
FIG. 26 is a cross-sectional view illustrating the state in which a polymer structure is coupled to a hemming structure according to another embodiment disclosed herein.

Referring to FIG. 22, in an electronic device (e.g., 400 in FIG. 5) according to various embodiments, a hemming structure (e.g., 451*b* in FIGS. 19 to 21) may be used as, for example, a leg engagement portion 490. The leg engagement portion 490 is a configuration formed on at least one surface of the side member 418, and may mean a portion clamped, for example, in the process of anodizing aluminum. A step formed between the inner surface of the side member and the hemming structure may be used as the leg engagement portion 490. FIG. 23 is a cross-sectional view illustrating a rear plate 411, a side member 418, and a hemming structure 451*a* in a housing of an electronic device (e.g., 400 in FIG. 5) according to another embodiment disclosed herein. FIG. 24 illustrates a perspective view of an internal structure of an electronic device (e.g., 400 in FIG. 5) including a conductive piece 450 according to various embodiments disclosed herein and an enlarged view of a portion of the internal structure. FIG. 25 is a cross-sectional view illustrating the state in which grooves 452 are formed in a side member 418 of a hemming structure 451*a* according to another embodiment disclosed herein. FIG. 26 is a cross-sectional view illustrating the state in which a polymer structure 440 is coupled to a hemming structure (e.g., 451*a* in FIG. 24) according to another embodiment disclosed herein.

According to various embodiments disclosed herein, the hemming structure 451a is spaced apart from the side member 418 by a predetermined distance so as to form a space (e.g., 453 in FIG. 14) between the hemming structure 451a and the side member 418, or, as illustrated in FIG. 23, the hemming structure 451a and the side member 418 may be in contact with each other.

Referring to FIG. 23, in an electronic device (e.g., 400 in FIG. 5) according to various embodiments disclosed herein, a slit 420a may be formed by processing at least a portion of the hemming structure 451a as well as the first portion S1 of the side member 418. In this case, in the state in which the separation distances between the substantial portions segmented into two by the slit 420 are kept constant, the slit 420 is filled with an insulating material 430 and the inner surface of the housing is covered with a polymer. In this manner, a housing may be manufactured.

FIG. 24 illustrates that a polymer structure 440 formed in the housing of FIG. 23. FIG. 24 may illustrate the state in which at least a portion of the first bent portion 451a and at least a portion of the second folded portion 418e are removed from the hemming structure 451a of FIG. 23.

Referring to FIGS. 23 and 24 together, in the case of forming the hemming structure 451a, according to various embodiments disclosed herein, two conductive pieces 450 may be provided within the first portion (the area S1). According to an embodiment, one conductive piece 450 in the first portion (the area S1) may be disposed to face the (1-1)th portion (the area S1a), and the other conductive piece 450 may be disposed to face the (1-2)th portion (the area S1b). Of course, according to various embodiments, the number of conductive pieces 450 may be set more variously, but may be set as small as possible for the rigidity of the housing and the product.

Referring to FIGS. 25 and 26 together, an electronic device (e.g., 400 in FIG. 5) according to various embodiments may include one or more grooves 452 formed in the hemming structure 451a or the side member 418 in order to increase the strength of a segmented portion while including a small number of conductive pieces 450.

The side member 418 according to various embodiments disclosed herein may include an outer surface 418a, an inner surface 418b, recess portions 418c, and concave-convex portions 418d. The recess portions 418c and the concave-convex portions 418d according to an embodiment may be formed in the inner surface 418b of the side member 418, and grooves (or a sink structure) (e.g., 452) may be formed in the inner surface 418b and surrounded by the recess portions 418c and the concave-convex portions 418d.

Referring to FIG. 26, protrusions 441 of the polymer structure 440 may be inserted into the grooves (e.g., 452) surrounded by the recess portions 418c and the concave-convex portions 418d. When the polymer structure 440 is formed through insert injection-molding according to an embodiment, the molten material supplied through the injection-molding machine may be solidified and disposed in the grooves (e.g., 452) surrounded by the recess portions 418c and the concave-convex portions 418d.

When the thickness of the preformed plate (e.g., 500 in FIG. 10) is reduced, the area where the grooves (e.g., 452) and the protrusions 441 formed by the recess portions 418c and the concave-convex portions 418d may be narrowed. However, according to various embodiments disclosed herein, since the bonding area is secured by the conductive piece 450, the bonding force between the housing and the polymer structure 440 may not be reduced even if the area where the grooves (e.g., 452) and the protrusions 441 are in contact with each other decreases.

Figure 27:
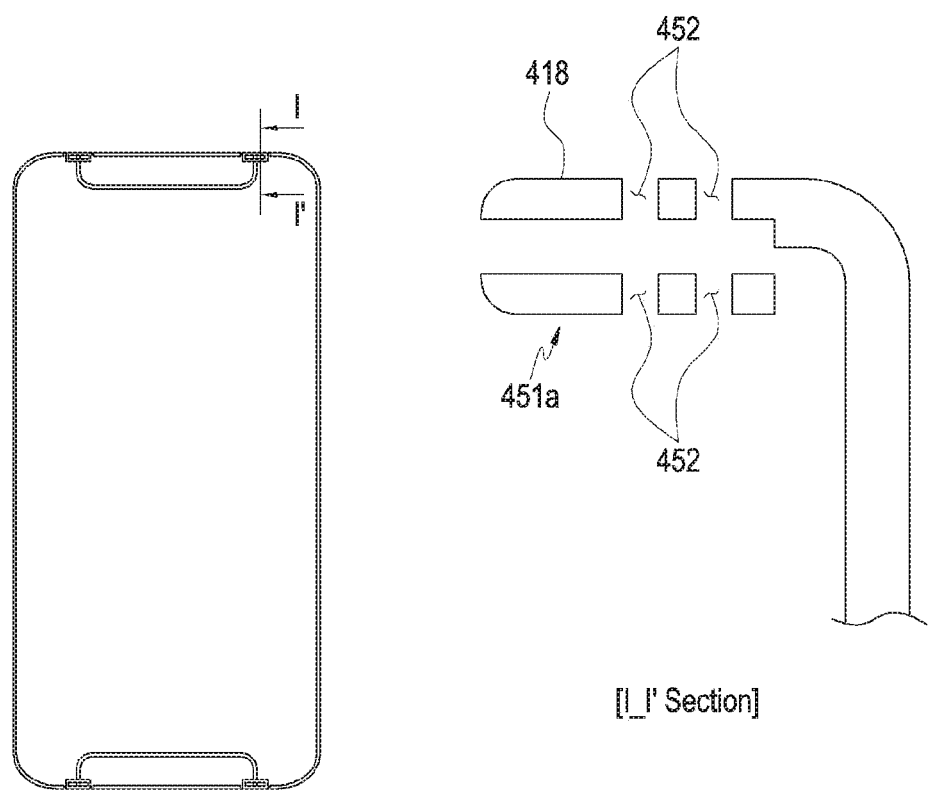
FIG. 27 is a view illustrating the state in which grooves are formed through a side member up to the outer surface of the side member in a hemming structure of an electronic device according to various embodiments disclosed herein.
Figure 28:
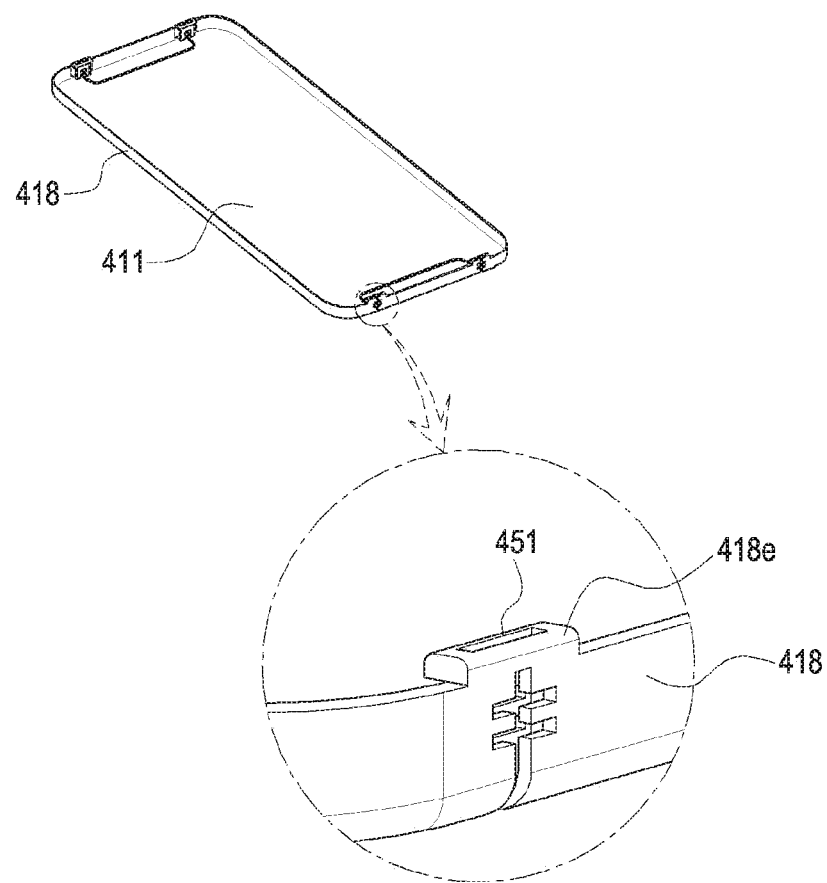
FIG. 28 is a view illustrating a hemming structure of an electronic device according to various embodiments disclosed herein, when viewed from the outside of a housing.

FIG. 27 is a view illustrating the state in which grooves 452 formed in a hemming structure 451a are formed to extend to the outer surface of the side member 418 in an electronic device (e.g., 400 in FIG. 5) according to various embodiments disclosed herein. FIG. 28 is a view illustrating a hemming structure (e.g., 451a) of an electronic device (e.g., 400 in FIG. 5) according to various embodiments disclosed herein, when viewed from the outside of the housing.

According to various embodiments disclosed herein, the grooves 452 may penetrate the housing of the electronic device (e.g., 400 in FIG. 5) not only in a direction vertical to a side member 418, but also in a direction horizontal to the side member 418 (or a widthwise direction).

Referring to FIGS. 27 and 28 together, grooves 452 formed in a hemming structure 451a according to various embodiments may be formed in the outer surface (e.g., 418a in FIG. 25) of the side member 419 as well as in the inner surface (e.g., 418b in FIG. 25) of the side member 418. In this case, the grooves 452 may extend to the outer surface (e.g., 418a in FIG. 25) through the recess portions (e.g., 418c in FIG. 25).

According to various embodiments, in addition to an insulating material (e.g., 430 in FIG. 5) filling a slit (e.g., 420a or 420c in FIG. 5) along the longitudinal direction thereof (e.g., the vertical (or height) direction of the side member 418), an insulating material (e.g., 430 in FIG. 5) filling the slit 420 along a direction perpendicular to the longitudinal direction of the slit 420 (e.g., the horizontal (or widthwise) direction of the side member 418) is added. Thus, the bonding force between the conductive material and the non-conductive material according to various embodiments disclosed herein can be increased.

For example, referring back to FIGS. 5 and 8 again, a housing according another embodiment disclosed herein may include: a first surface (e.g., 402 in FIG. 5), a second surface (e.g., 411 in FIG. 5) facing a direction opposite a direction faced by the first surface (e.g., 402 in FIG. 5), and a side member (e.g., 418 in FIG. 5) surrounding the space formed between the first surface (e.g., 402 in FIG. 5) and the second surface (e.g., 411 in FIG. 5) and formed integrally with or separately from the second surface (e.g., 411 in FIG. 5).

The side member 418 may include: a first electrically conductive member (e.g., the left portion of the housing separated with reference to the insulating member 430 in FIG. 8) including a first electrically conductive material (e.g., an aluminum alloy, a magnesium alloy, a zinc alloy, a copper alloy, a titanium alloy, stainless steel, or an amorphous metal); a second electrically conductive member (e.g., the right portion of the housing separated with reference to the insulating material 430 in FIG. 8) including the first electrically conductive material and electrically insulated from the first electrically conductive member; a third electrically conductive member (e.g., 450 in FIG. 8) disposed in the space to face at least one of the first electrically conductive member and the second electrically conductive member; and a polymer structure (e.g., 440 in FIG. 8) disposed adjacent to the first, second, and third electrically conductive members. Hereinafter, detailed descriptions of components the same as or similar to those of the above-described embodiments may be omitted.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semipermanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Various embodiments disclosed herein may provide an electronic device (e.g., 400 in FIG. 5) including: a housing that includes: a front plate (e.g., 402 in FIG. 5); a rear plate (e.g., 411) facing a direction opposite a direction faced by the front plate; and a side member (e.g., 418 in FIG. 5) formed integrally with the rear plate and surrounding the space between the front plate and the rear plate, wherein a substantial portion of the rear plate and the side member may be formed of an electrically conductive member, and the rear plate and the side member include a slit (e.g., 420 in FIG. 5) extending from a first portion of the side member to a third portion of the side member through a second portion of the rear plate, thereby separating the substantial portion of the rear plate and the side member into two portions, and an insulating material (e.g., 430 in FIG. 8) filling the slit; a display (e.g., 401 in FIG. 5) exposed through the front plate; a polymer structure (e.g., 440 in FIG. 8) that is in contact with at least one portion of the first portion, at least a portion of the second portion, and at least a portion of the slit; and at least one conductive piece (e.g., 450 in FIG. 8) at least partially mounted on the polymer structure.

According to various embodiments, the polymer structure (e.g., 440 in FIG. 8) may be formed of the same material as the insulating material (e.g., 430 in FIG. 8).

According to various embodiments, the polymer structure (e.g., 440 in FIG. 8) may be formed integrally with the insulating material (e.g., 430 in FIG. 8).

According to various embodiments, the at least one conductive piece (e.g., 450 in FIG. 5) may be formed of the same material as the electrically conductive material (e.g., 450 in FIG. 5).

According to various embodiments, the at least one conductive piece (e.g., 450 in FIG. 5) may include aluminum.

According to various embodiments, the maximum thickness of the side member (e.g., 418 in FIG. 5) in a direction orthogonal to the rear plate (e.g., 411 in FIG. 5) may be equal to the maximum thickness of the rear plate.

According to various embodiments, the maximum thickness of the side member (e.g., 418 in FIG. 5) in the direction orthogonal to the rear plate (e.g., 411 in FIG. 5) may be equal to or smaller than 1.2 mm.

According to various embodiments, the electronic device may further include a wireless communication circuit (e.g., the communication module 190 in FIG. 1) electrically connected to one point adjacent to the first portion or the second portion of the side member (e.g., 418 in FIG. 5).

According to various embodiments, the at least one conductive piece (e.g., 450 in FIG. 5) may be separated from the side member (e.g., 418 in FIG. 8) and the rear plate (e.g., 411 in FIG. 8).

According to various embodiments, at least one of the two portions divided from the substantial portion may function as an antenna.

According to various embodiments, the conductive piece (e.g., 450 in FIG. 8) may be spaced apart from the side member (e.g., 418 in FIG. 8) by a predetermined distance.

According to various embodiments, the conductive piece (e.g., 450 in FIG. 13) may have a groove (e.g., 452 in FIG. 13) into which the polymer member (e.g., 440 in FIG. 5) is insertable.

According to various embodiments, the groove (e.g., 452 in FIG. 13) may be formed to extend to the outer surface of the side member (e.g., 418 in FIG. 13). (e.g., see FIG. 28).

According to various embodiments, the conductive piece (e.g., 450 in FIG. 8) is formed by removing at least a portion (e.g., 451 in FIG. 13) of a hemming structure (e.g., 451*a* in FIG. 13) integrally extending and bent from the side member (e.g., 418 in FIG. 13).

Various embodiments disclosed herein may provide an electronic device including: a housing including a rear plate (e.g., 411 in FIG. 5), a side member (e.g., 418 in FIG. 5) disposed in at least a portion of a periphery of the rear plate; a polymer structure (e.g., 440 in FIG. 8) that is in contact with at least a portion of the rear plate (e.g., 411 in FIG. 5) and at least a portion of the side member (e.g., 418 in FIG. 5); a slit (e.g., 420*d*, 420*f* in FIG. 6A, or 420*d'*, 420*f'*, 420*d'''*, 420*f'''* in FIG. 6B) formed in at least a portion of the side member; and at least one conductive piece (e.g., 450 in FIG. 8) having the same material as the side member, wherein the conductive piece is disposed at the position where the slit is formed, to face the side member.

According to various embodiments, the slit (e.g., 420*d*, 420*f* in FIG. 6A, or 420*d'*, 420*f'*, 420*d'''*, 420*f'''* in FIG. 6B) divides the housing into two electrically insulated portions, and at least one of the two electrically insulated portions may function as an antenna.

According to various embodiments, the conductive piece (e.g., 450 in FIG. 5) may be spaced apart from the side member (e.g., 418 in FIG. 5), and at least a portion of the polymer structure (e.g., 440 in FIG. 8) may be disposed between the conductive piece and the side member.

According to various embodiments, the conductive piece (e.g., 450 in FIG. 8) may be formed by removing at least a portion of a hemming structure (e.g., 451*a* in FIG. 13) integrally extending and bent from the side member (e.g., 418 in FIG. 13).

According to various embodiments disclosed herein, a housing of an electronic device (e.g., 400 in FIG. 5) may include: a first surface (e.g., 402 in FIG. 5), a second surface (e.g., 411 in FIG. 5) facing a direction opposite to a direction faced by the first surface (e.g., 402 in FIG. 5), and a side member (e.g., 418 in FIG. 5) surrounding the space formed between the first surface (e.g., 402 in FIG. 5) and the second surface (e.g., 411 in FIG. 5) and formed integrally with or separately from the second surface (e.g., 411 in FIG. 5).

Here, embodiments disclosed herein may provide a housing of an electronic device, wherein the housing includes: a side member (e.g., 418 in FIG. 5) that includes: a first electrically conductive member (e.g., the left portion of the housing separated with reference to the insulating member 430 in FIG. 8) including a first electrically conductive material (e.g., an aluminum alloy, a magnesium alloy, a zinc alloy, a copper alloy, a titanium alloy, stainless steel, or an amorphous metal); a second electrically conductive member (e.g., the right portion of the housing separated with reference to the insulating material 430 in FIG. 8) including the first electrically conductive material and electrically insulated from the first electrically conductive member; a third electrically conductive member (e.g., 450 in FIG. 8) disposed in the space to face at least one of the first electrically conductive member and the second electrically conductive member; and a polymer structure (e.g., 440 in FIG. 8) disposed adjacent to the first, second, and third electrically conductive members.

The side member, including at least one of the first electrically conductive member (e.g., the left portion of the housing separated with reference to the insulating material 430 in FIG. 8) or the second electrically conductive member (e.g., the right portion of the housing separated with reference to the insulating material 430 in FIG. 8), may function as an antenna.

It may be apparent to a person ordinarily skilled in the technical field to which the disclosure belongs that the above-mentioned electronic device and electronic device housing structure according to various embodiments disclosed herein are not limited by the above-mentioned embodiments and drawings, and may be variously substituted, modified, and changed within the technical scope disclosed herein.

The invention claimed is:

1. An electronic device comprising:
   a housing including: a front plate; a rear plate facing a direction opposite a direction faced by the front plate; and a side member formed integrally with the rear plate and surrounding a space between the front plate and the rear plate,
   wherein a substantial portion of the rear plate and the side member is formed of an electrically conductive member, and
   wherein the rear plate and the side member include:
      a slit extending from a first portion of the side member to a third portion of the side member through a second portion of the rear plate, thereby dividing the substantial portion of the rear plate and the side member into two portions, and
      an insulating material filling the slit;
   a display exposed through the front plate;
   a polymer structure positioned to contact with at least one portion of the first portion, at least a portion of the second portion, and at least a portion of the slit; and
   at least one conductive piece at least partially embedded on the polymer structure.

2. The electronic device of claim 1, wherein the polymer structure is formed of a same material as the insulating material.

3. The electronic device of claim 2, wherein the polymer structure is formed integrally with the insulating material.

4. The electronic device of claim 1, wherein the at least one conductive piece is formed of a same material as the electrically conductive material.

5. The electronic device of claim 4, wherein the at least one conductive piece includes aluminum.

6. The electronic device of claim 1, wherein a maximum thickness of the side member in a direction perpendicular to the rear plate is equal to a maximum thickness of the rear plate.

7. The electronic device of claim 6, wherein the maximum thickness of the side member in the direction perpendicular to the rear plate is equal to or less than 1.2 mm.

8. The electronic device of claim 1, further comprising:
a wireless communication circuit electrically connected to a point of the side member adjacent to the first portion or the second portion.

9. The electronic device of claim 1, wherein the at least one conductive piece is separated from the side member and the rear plate.

10. The electronic device of claim 1, wherein at least one of the two portions divided from the substantial portion functions as an antenna.

11. The electronic device of claim 1, wherein the conductive piece is spaced apart from the side member by a predetermined distance.

12. The electronic device of claim 1, wherein the conductive piece has a groove into which the polymer member is insertable.

13. The electronic device of claim 12, wherein the groove is formed to extend to the outer surface of the side member.

14. The electronic device of claim 1, wherein the conductive piece is formed by removing at least a portion of a hemming structure integrally extending and bent from the side member.

15. The electronic device of claim 1, wherein the side member includes:
a first electrically conductive member including a first electrically conductive material;
a second electrically conductive member including the first electrically conductive material, and electrically insulated from the first electrically conductive member;
a third electrically conductive member disposed in the space, and disposed to face at least one of the first electrically conductive member or the second electrically conductive member; and
wherein the polymer structure is disposed adjacent to the first electrically conductive material, the second electrically conductive member, and the third electrically conductive member.

* * * * *